(12) United States Patent
Yamazaki et al.

(10) Patent No.: US 6,893,906 B2
(45) Date of Patent: May 17, 2005

(54) ELECTRO-OPTICAL DEVICE AND DRIVING METHOD FOR THE SAME

(75) Inventors: Shunpei Yamazaki, Tokyo (JP); Akira Mase, Kanagawa-ken (JP); Masaaki Hiroki, Kanagawa-ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/728,989

(22) Filed: Dec. 8, 2003

(65) Prior Publication Data

US 2004/0115953 A1 Jun. 17, 2004

Related U.S. Application Data

(62) Division of application No. 09/919,949, filed on Aug. 2, 2001, now abandoned, which is a division of application No. 08/247,452, filed on May 23, 1994, now Pat. No. 6,369,788.

(30) Foreign Application Priority Data

Nov. 26, 1990 (JP) .............................................. 2-323694
Dec. 10, 1990 (JP) .............................................. 2-415720

(51) Int. Cl.$^7$ .............................................. H01L 21/00
(52) U.S. Cl. ........................................ 438/149; 257/72
(58) Field of Search .................. 438/30, 488, 149–155, 438/608–609; 257/57–59, 65–66, 72, 347

(56) References Cited

U.S. PATENT DOCUMENTS

| | | |
|---|---|---|
| 3,896,430 A | 7/1975 | Hatsukano |
| 4,409,134 A | 10/1983 | Yamazaki |
| 4,581,620 A | 4/1986 | Yamazaki et al. |
| 4,727,044 A | 2/1988 | Yamazaki |
| 4,752,774 A | 6/1988 | Clerc et al. |

(Continued)

FOREIGN PATENT DOCUMENTS

| | | |
|---|---|---|
| CA | 1296438 | 4/1989 |
| DE | 0 265 973 A1 | 3/1989 |
| EP | 0 259 875 A2 | 3/1988 |
| EP | 0 276 002 A3 | 7/1988 |
| EP | 0 297 664 A3 | 1/1989 |
| GB | 1 447 639 | 8/1976 |
| GB | 2070857 | 9/1981 |
| JP | 49-077537 | 7/1974 |
| JP | 53-144297 | 12/1978 |
| JP | 57-078185 | 5/1982 |
| JP | 59-099887 | 6/1984 |

(Continued)

OTHER PUBLICATIONS

Young, c., "*The New Penguin Dictionary Of Electronics*", Penguin Books, 1979, pp.78–81.
Related U.S. Appl. No. 08/788,560 (Copy Of Specification And Drawings).

*Primary Examiner*—David Nelms
*Assistant Examiner*—David Vu
(74) *Attorney, Agent, or Firm*—Nixon Peabody LLP; Jeffrey L. Costellia

(57) ABSTRACT

A display and a driving method for the same capable of constructing clear visual images is described. In the display, a plurality of conductive pads are opposed to a back electrode with a light influencing medium such as a liquid crystal layer. Control signals are supplied to the conductive pads through complimentary transistors comprise a p-channel field effect transistor and an n-channel field effect transistor connected between $V_{DD}$ and $V_{SS}$ lines of a control circuit, which also supplies a bias voltage to the back electrode and gate control signals to the gate terminals of the p-channel field effect transistor and the n-channel field effect transistor. During operation, the bias voltage is inverted in order to invert the polarity of control signal applied across the light influencing medium.

24 Claims, 21 Drawing Sheets

| U.S. PATENT DOCUMENTS | | | |
|---|---|---|---|
| 4,755,865 A | | 7/1988 | Wilson et al. |
| 4,766,477 A | | 8/1988 | Nakagawa et al. |
| 4,772,927 A | | 9/1988 | Saito et al. |
| 4,775,861 A | | 10/1988 | Saito |
| 4,812,328 A | | 3/1989 | Saitoh et al. |
| 4,818,077 A | | 4/1989 | Ohwada et al. |
| 4,818,981 A | | 4/1989 | Oki et al. |
| 4,842,372 A | | 6/1989 | Toyama |
| 4,905,066 A | | 2/1990 | Dohjo et al. |
| 4,954,855 A | | 9/1990 | Mimura et al. |
| 5,075,244 A | * | 12/1991 | Sakai et al. .................... 438/59 |
| 5,084,905 A | * | 1/1992 | Sasaki et al. ............... 257/776 |
| 5,313,077 A | | 5/1994 | Yamazaki |
| 5,315,132 A | | 5/1994 | Yamazaki |
| 5,543,636 A | | 8/1996 | Yamazaki |
| 6,281,520 B1 | | 8/2001 | Yamazaki |

| FOREIGN PATENT DOCUMENTS | | |
|---|---|---|
| JP | 60-245173 | 12/1985 |
| JP | 63-082177 | 4/1988 |
| JP | 63-096636 | 4/1988 |
| JP | 63-172193 | 7/1988 |
| JP | 64-001273 | 1/1989 |
| JP | 64-010222 | 1/1989 |
| JP | 1-107237 | 4/1989 |
| JP | 01-156725 | 6/1989 |
| JP | 2-1823 | 1/1990 |
| JP | 02-090531 | 3/1990 |
| JP | 02-178632 | 7/1990 |
| JP | 2-214819 | 8/1990 |
| JP | 02-230130 | 9/1990 |
| JP | 02-234134 | 9/1990 |

* cited by examiner

ELECTRO-OPTICAL DEVICE AND DRIVING METHOD FOR THE SAME

BACKGROUND OF THE INVENTION

1. Field of the Invention

The present invention relates to a display and a driving system for the same and, more particularly to a display driving system utilizing complimentary thin film gate insulated field effect transistors suitable for used in liquid crystal displays.

2. Description of the Prior Art

There have been well known in the art active liquid crystal displays which are driven by thin film transistors (TFTs). The displays of this type comprise visual panels and peripheral circuits for driving the panel. The peripheral circuit is formed by attaching a single crystalline chip containing integrated circuits on a glass substrate by tab-bonding or COG (chip on glass). The visual panel comprises a plurality of pixels each being provided with a driving TFT. The TFT is usually an N-channel FET formed within an amorphous or polycrystalline semiconductor film which is electrically coupled to a respective pixel.

FIG. 1 is a diagram illustrating the equivalent circuit of an exemplary liquid crystal display. The diagram shows only a 2×2 matrix for the sake of convenience in description whereas ordinary liquid crystal displays consist of more great numbers of pixels such as those in the form of a 640×480 matrix, a 1260×960 matrix and so on. The liquid crystal display includes a liquid crystal layer 42 disposed between a pair of glass substrates 11 and 11' as shown in FIG. 2. Numeral 54 designates a polarizing plate. The inner surface of the glass substrate 11' is coated with a ground electrode 53. The inner surface of the other substrate 11 is provided with a plurality of conductive pads each constituting one pixel of the display. Each conductive pad is formed together with an N-type FET 51 whose source is electrically connected with the corresponding pad. The drains of the FETs on a similar row in the matrix is connected with a control line of the row to which control signals are supplied from a row driver 47. The gates of the N-type FETs on a similar column is connected with a control line of the column to which control signals are supplied from a column driver 46.

In the operation of the display, the column driver 46 supplies control signals of a high level to selected columns to turn on the TFTs on the column. There are, however, undesirable cases in which the on-off action of the TFTs can not sufficiently carry out so that the output voltage of the TFT (i.e. the input to the pixel) reaches only short of a predetermined high voltage level (e.g. 5V), or the output voltage does not sufficiently fall to a predetermined low voltage (e.g. 0V). This is because of the asymmetrical characteristics of the TFTs. Namely, the charging action on the liquid crystal layer takes place in a dissimilar manner as the discharging action therefrom. Furthermore, since the liquid crystal is intrinsically insulating, the liquid crystal voltage ($V_{LC}$) becomes floating when the TFT is turned off. The amount of electric charge accumulated on the liquid crystal which is equivalent to a capacitance determines the $V_{LC}$. The accumulated charge, however, will leak through a channel resistance $R_{SU}$ which may be formed by dust or ionized impurities or through the liquid crystal itself whose resistance $R_{LC}$ 44 may be occasionally decreased. For this reason, $V_{LC}$ sometimes becomes an indeterminate intermediate voltage level. In the case of the panel having two hundred thousands to 5 million pixels, a high yield can not be expected in such a situation.

Furthermore, in the conventional driving methods, the liquid crystal material to which control voltages are applied are subjected to an average electric field in one direction during operation. The electric field tends to cause electrolysis when continuously used. Because of this, the aging of the liquid crystal material is accelerated and the life time of the display is decreased.

BRIEF SUMMARY OF THE INVENTION

It is an object of the present invention to provide a display and a driving method for the same capable of demonstrating clear visual images.

It is another object of the present invention to provide a display and a driving method for the same capable of accurate operation.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a display comprises a light influencing medium, electrode patterns defining a plurality of pixels in the medium and a control circuit for supplying control signals to the electrode patterns. The control circuit supplies the control signal to each pixel through a switching element which comprises at least one complimentary transistors connected between a low level and a high level. By the use of the complimentary transistors, the voltage level of each pixel during its operation is prevented from fluctuating.

In typical driving methods, the display of this type is driven by applying control signals in the form of pulses to conductive pads. The light influencing medium is disposed between the conductive pads and a back electrode. The back electrode is supplied with an alternate voltage in order to make zero the average voltage applied to the light influence medium.

In typical example, the present invention is applied to liquid crystal displays. Each pixel of the display is provided with a switching element of complimentary thin film field effect transistors which forcibly pull or push the level of the liquid crystal layer to a definite high or low voltage level rather than a floating state. Of course, the present invention can be practiced with a variety of other type transistors, other than thin film transistors, such as staggered types, coplanner types, inverted staggered types, inverted coplanner types. The channel regions of the transistors may be spoiled by introduction of a suitalbe impurity in order to eliminate the undesirable influence of incident light by reducing the photosensitivity of the transistors. When control transistors of a driver for supplying control signals to the switching transistors are formed also on the same substrate at its peripheral position where no light is incident, they are not spoiled by the impurity. In such a case, two types of transistors are formed on the substrate, one being spoiled and the other not being spoiled and having a carrier mobility 2 to 4 times larger than that of the spoiled transistors.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 2:
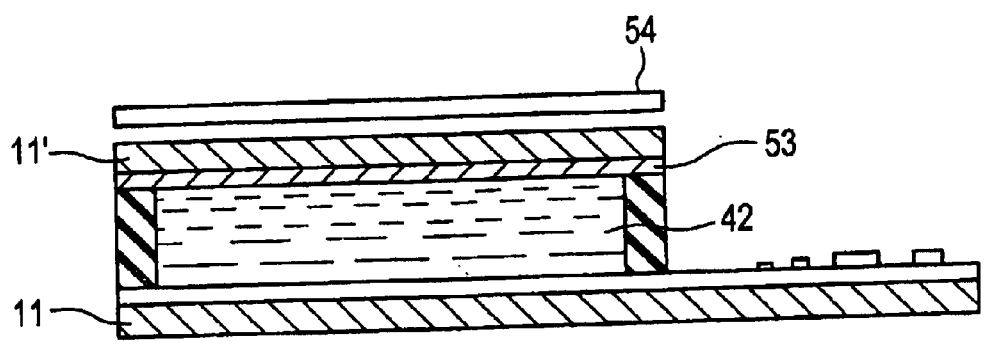
FIG. 2 is a cross sectional schematic view showing an general configuration of a liquid crystal display.
Figure 3:
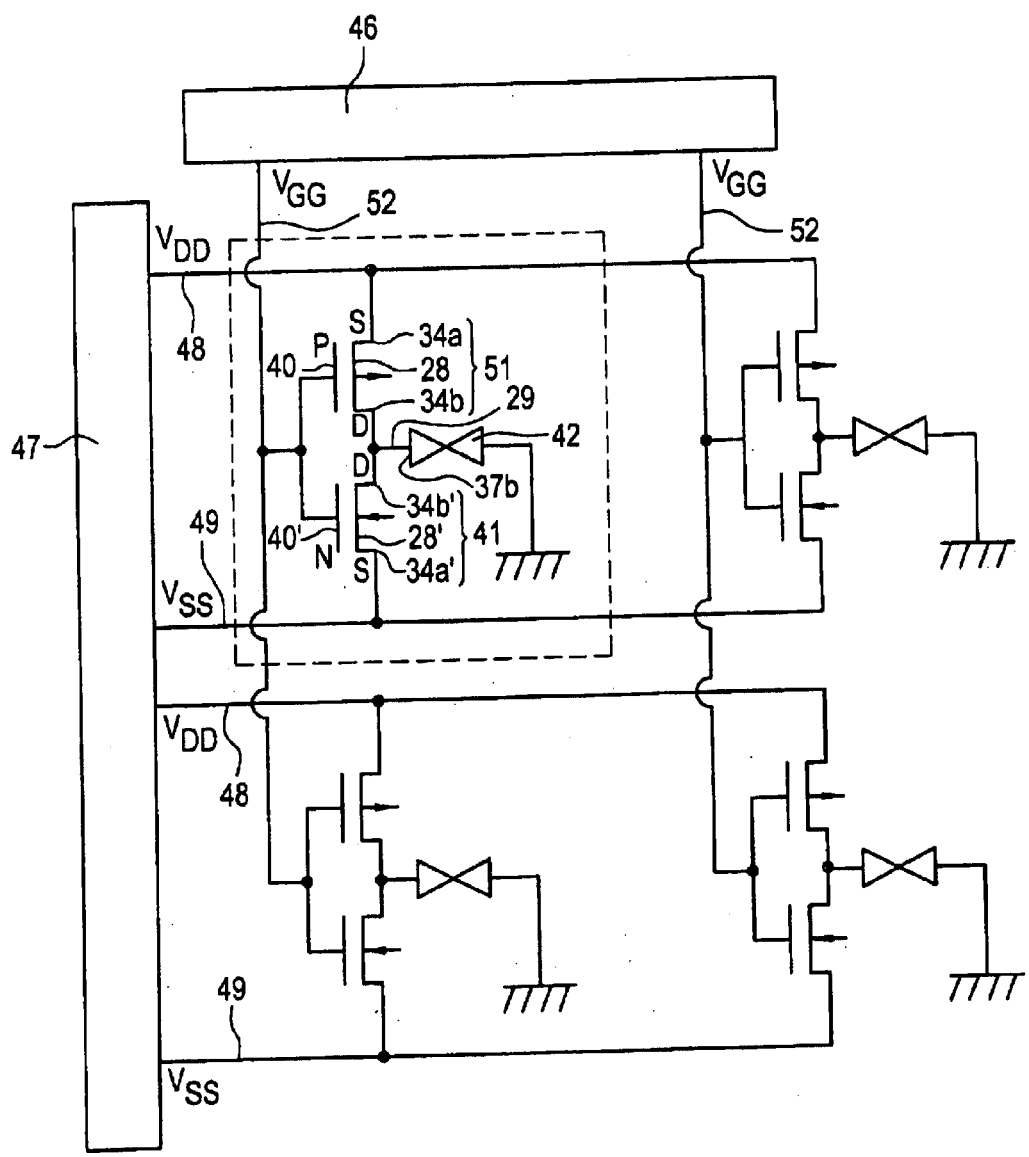
FIG. 3 is a schematic diagram showing an equivalent circuit of a liquid crystal display in accordance with a first embodiment of the present invention.
Figure 4A:
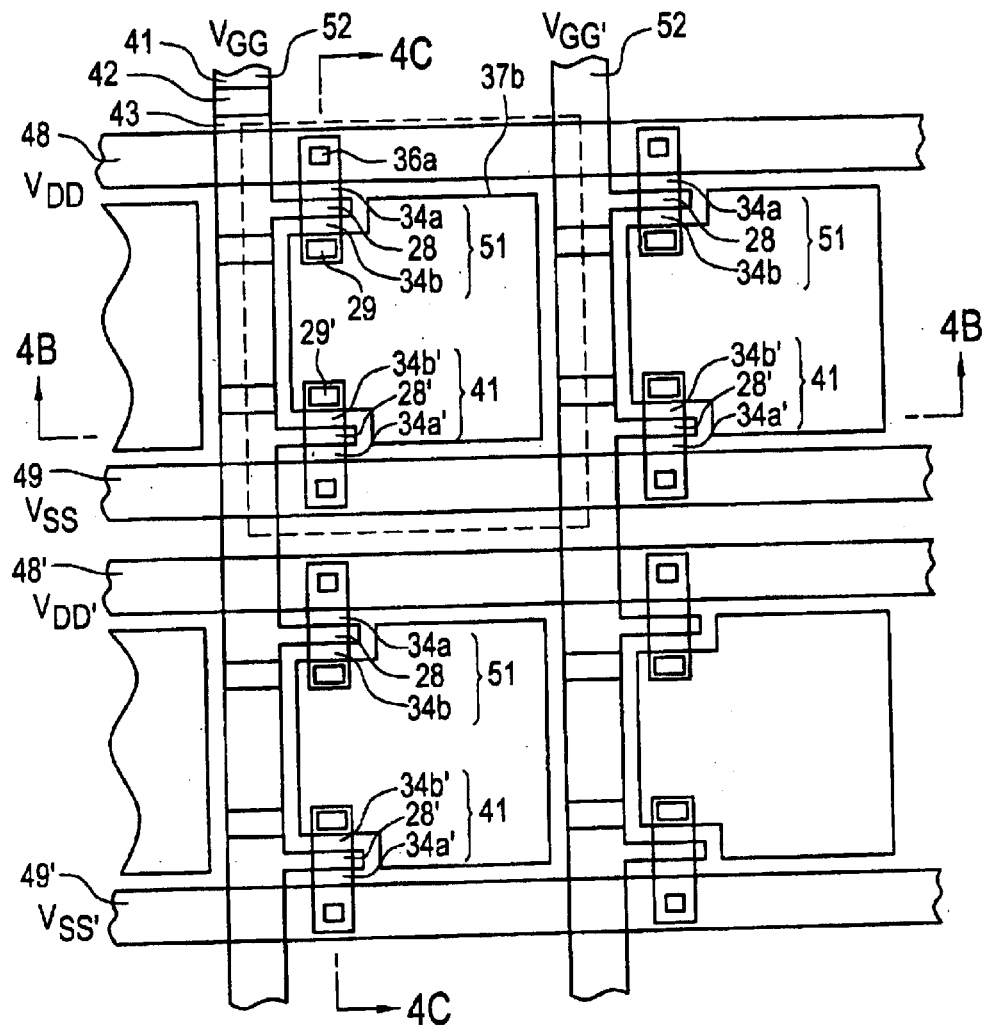
FIGS. 4(A), 4(B) and 4(C) are plan and cross sectional views showing the liquid crystal display illustrated in FIG. 3.

FIG. 3 is a diagram illustrating the equivalent circuit of a liquid crystal display in accordance with a first embodiment of the present invention. The diagram shows only a 2×2 matrix for the sake of convenience in description whereas ordinary liquid crystal displays consist of more great numbers of pixels such as a 640×480 matrix, a 1260×960 matrix. The liquid crystal display includes a liquid crystal layer 42 disposed between a pair of glass substrates 11 and 11' as shown in FIG. 2. The inner surface of the glass substrate 11' is coated with an electrode 53. The inner surface of the other substrate 11 is provided with a plurality of conductive pads 37b each constituting one pixel of the display as seen from FIG. 4(A). Dashed line is enclosing one pixel in the figure. Each conductive pad 37b are formed on the substrate together with CMOS transistors consisting of an N-type FET 41 and a P-type FET 51 whose drains 34b' and 34b are electrically connected with the corresponding pad 37b. The sources of the P-type FETs of the CMOSs on a similar row is connected with a $V_{DD}$ line 48 of the row. The sources of the N-type FETs of the CMOSs on a similar row is connected with a VSS line 49 of the row. The gates of the P-type and N-type FETs of the CMOSs on a similar column is connected with a $V_{GG}$ line of the column. The VSS lines and the $V_{DD}$) lines are connected with a row driver 47 and supplied with control signal therefrom. The $V_{GG}$ lines 52 are connected with a column driver 46 and supplied with control signal therefrom. The column driver 46 and the row driver 47 are formed on the projected end of the glass substrate 21 as will understood form the illustration of FIG. 2.

When a TN liquid crystal material is used, the distance of the substrates is selected to be about 10 µm and both the inner surfaces of the substrates are provided with orientation control films which are given suitable rubbing treatment. When a ferroelectric liquid crystal (FLC) material is used, the distance of the substrates is selected to be about 1.5 to 3.5 µm, e.g. 2.3 µm and only one of the inner surfaces (the surface of the ground electrode) is provided with an orientation control film given suitable rubbing treatment. The driving voltage is ±20V. When a liquid crystal material of dispersion type or a polymer liquid crystal material is used, the distance of the substrates is selected to be about 1.0 to 10.0 µm, e.g. 2.3 µm and no orientation control film is necessary. The driving voltage is ±10 to ±15V. In this case, polarization plates are also unnecessary and therefore the amount of available light can be relatively increased in either type of transmission and reflective types. Accordingly, whereas the liquid crystal layer possesses no threshold voltage, a large contrast in displayed images is realized and undesirable cross-talk is effectively prevented by the use of complimentary TFTs which provide a definite threshold voltage.

Figure 5A:
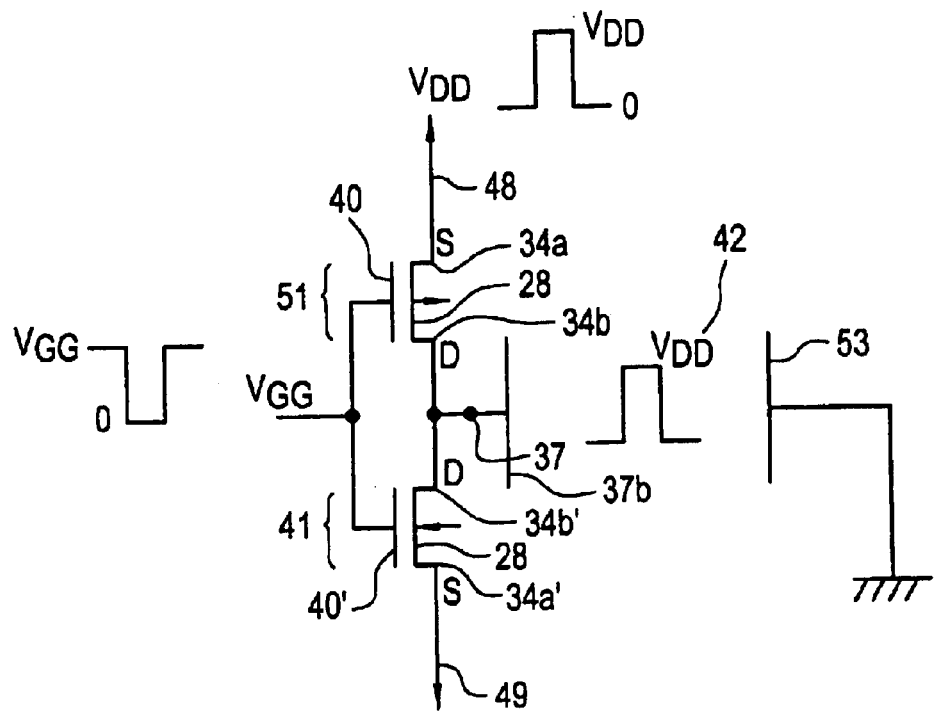
FIGS. 5(A) and 5(B) are explanatory views demonstrating operation of the liquid crystal display in accordance with the first embodiment.
Figure 5B:
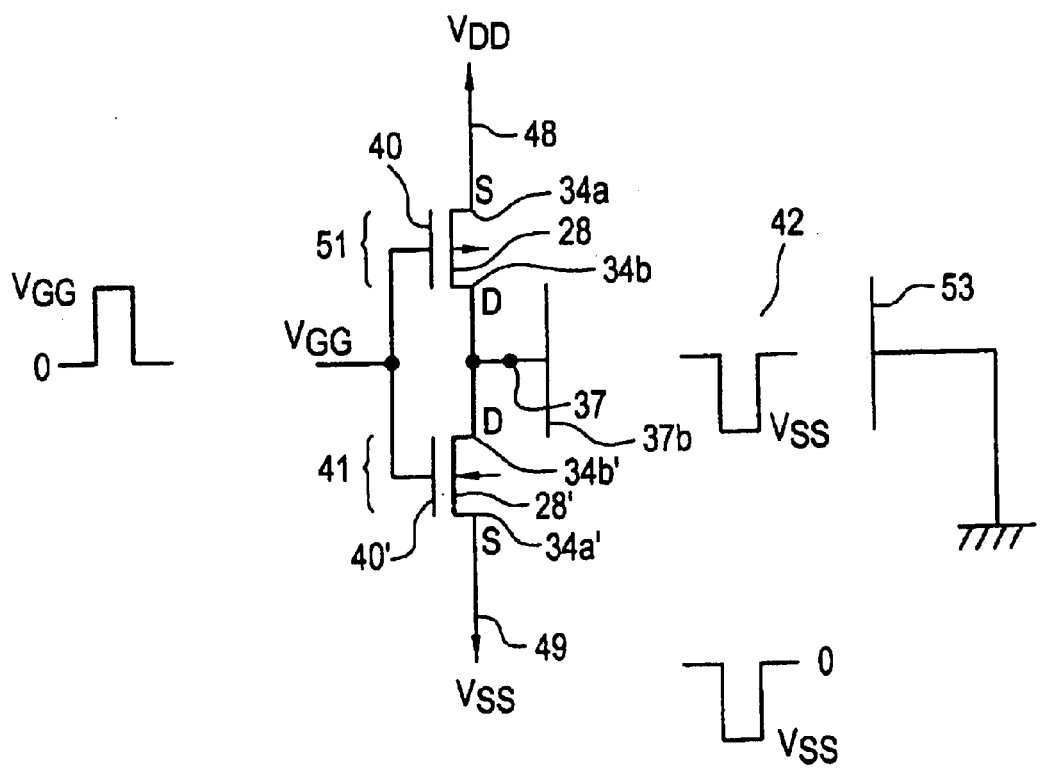

The operation of the complimentary transistors will be explained with reference to FIGS. 5(A) and 5(B). When a control signal of a low level (0V) is supplied to the gates 28 and 28', the p-channel TFT 41 is turned off while the n-channel TFT 51 is turned on. The output terminal of the complimentary TFTs 29 is releived of the $V_{SS}$ line and connected to the $V_{DD}$ line and therefore pulled up to a high voltage $V_{DD}$ (e.g. +10V) when an input signal of the high voltage is applied to the $V_{DD}$ line. On the contrary, when a control signal of a high level (5V) is supplied to the gates 28 and 28' as shown in FIG. 5(B), the p-channel TFT 41 is turned on while the n-channel TFT 51 is turned off. The output terminal of the complimentary TFTs 29 is releived of the $V_{DD}$ line and connected to the $V_{SS}$ line and therefore pushed down to a low voltage (e.g. −10V or 0V) when an input signal of the low voltage is applied to the VSS line. In the operation of the display, the column driver 46 supplies control signals of the low level to selected columns to connect the $V_{DD}$ line 48 with the pads 37b on the columns and disconnect the VSS line 49 from the pads 37b on the columns. On the other hand, the row driver 47 supplies control signals of the high level to selected rows by means of the $V_{DD}$ line to pull up the desired pads located on the selected columns and the selected rows at the same time. Namely, in the operation, the liquid crystal layer is selectively subjected to three voltage levels, i.e. −10V, 0V and +10V at the respective pixels to form an arbitrary visual pattern.

Figure 6:
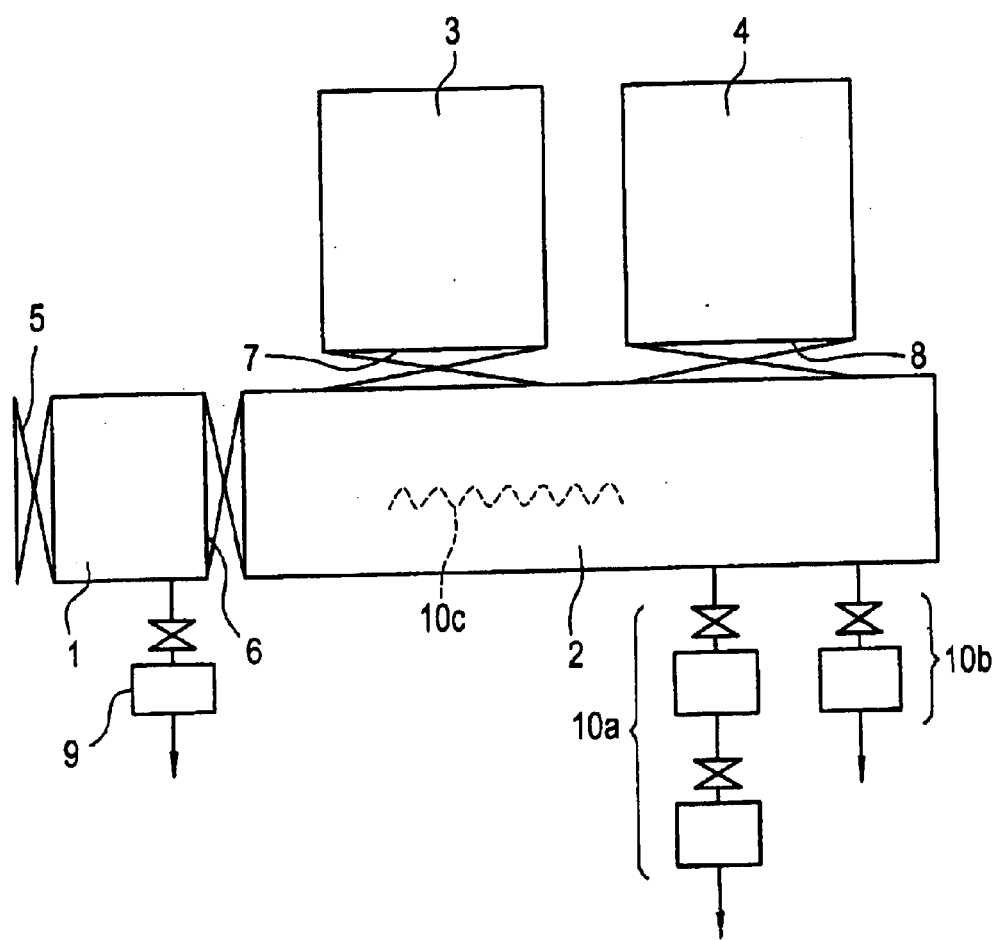
FIG. 6 is a schematic view showing a system suitable for manufacturing thin film field effect semiconductor transistors in accordance with the present invention.

Referring now to FIG. 6, FIGS. 7(A) and 7(B) and FIGS. 8(A) to 8(F), a method of manufacturing gate insulated field effect transistors 41 and 51 constituting a CMOS in accordance with a first embodiment of the present invention will be explained. FIG. 6 is a schematic view showing multi-chamber sputtering system for depositing semiconductor and oxide films by magnetron RF sputtering. The system comprises a loading and unloading pre-chamber 1 provided with a gate valve 5, a subsidiary chamber 2 connected to the pre-chamber 1 through a valve 6 and first and second individual sputtering apparatuses 3 and 4 connected to the subsidiary chamber 2 respectively through valves 7 and 8. The pre-chamber 1 is provided with an evacuation system 9 comprising a rotary pump and a turbo molecular pump in series. The subsidiary chamber 2 is provided with a first evacuation system 10a for roughing comprising a rotary pump and a turbo molecular pump in series, a second evacuation system 10b for high vacuum evacuation comprising a cryosorption pump and a heater 10c located in the chamber 2 in order to heat substrates to be coated. If substrates to be coated are thermally contracted in advance by heating in the subsidiary chamber 2, thermal contraction and stress caused in films during deposition thereof on the substrate is reduced so that the adhesivity of the films can be improved.

Figure 7A:
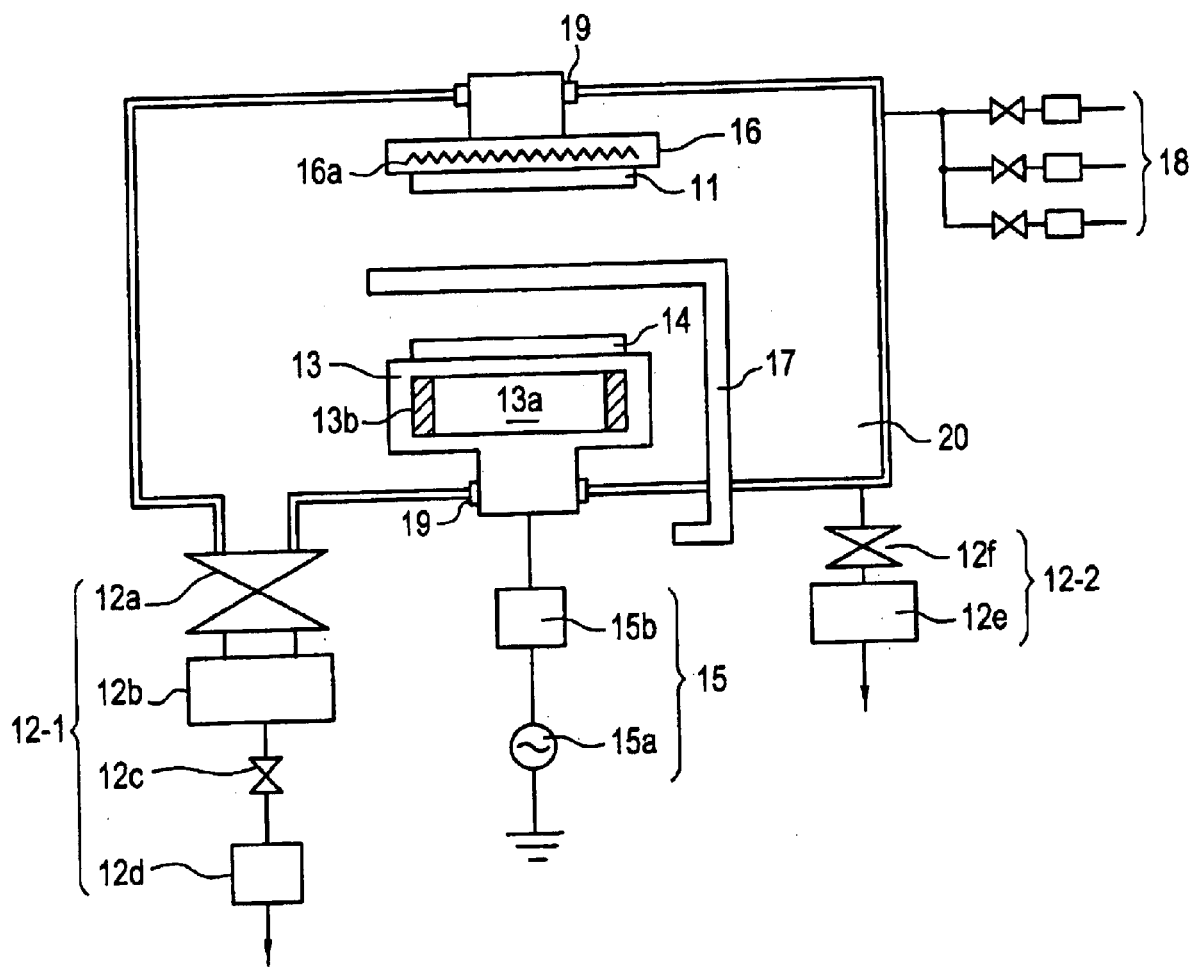
FIG. 7(A) is a schematic view showing a planar type magnetron RF sputtering apparatus of the system illustrated in FIG. 6 suitable for use in depositing oxide and semiconductor films.
Figure 7B:
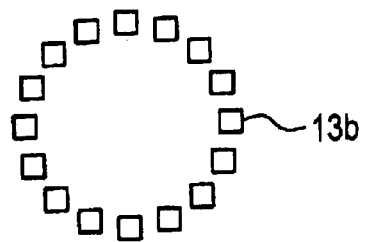
FIG. 7(B) is an explanatory view showing the arrangement of magnets provided in the apparatus as illustrated in FIG. 7(A).

The sputtering apparatuses 3 and 4 are individual planar type magnetron RF sputtering apparatuses suitable for exclusive use in depositing oxide films and semiconductor films respectively when used in accordance with the present invention. FIGS. 7(A) and 7(B) illustrate details of the RF sputtering apparatus. The apparatus comprises a vacuum chamber 20, a first evacuation system 12-1 for roughing consisting of a turbo molecular pump 12b and a rotary pump 12d respectively provided with valves 12a and 12c, a second evacuation system 12-2 for high vacuum evacuation comprising a cryosorption pump 12e provided with a valve 12f, a metallic holder 13 fixed in the lower side of the chamber 20 for supporting a target 14 thereon, formed with an inner conduit 13a through which a coolant can flow to cool the target 14 and provided with a number of magnets 13b such as parmanent magnets, an energy supply 15 consisting of an RF (e.g. 13.56 MHz) source 15a provided with a matching box 15b for supplying RF energy to the holder 13, a substrate holder 16 located in the upper position of the chamber 20 for supporting a substrate 11 to be coated, a heater 16a embedded in the substrate holder 16, a shutter 17 intervening the substrate 11 and the target 14 and a gas feeding system 18. Numeral 19 designates sealing means for ensuring air-tight structure of the vacuum chamber 20. In advance of actual deposition on the substrate 11, impurities occurring in the targets are sputtered and deposited on the shutter 17 intervening the substrate 11 and the target 14, and then the shutter is removed in order to enable normal deposition on the substrate 11. The magnets 13b are oriented to have their N poles at the upper ends and S poles at the lower ends and horizontally arranged in a circle as illustrated in FIG. 7(B) in order to confine electrons in a sputtering region between the substrate 11 and the target 14.

Referring now to FIGS. 8(A) to 8(F) together with FIG. 6 and FIGS. 7(A) and 7(B), a method of manufacturing thin film field effect transistors 41 and 51 in accordance with the first preferred embodiment of the invention will be described in details. This exemplary method is carried out with a multi-chamber apparatus suitable for mass-production. This is, however, applicable to similar processes utilizing separate chambers without substantial modification.

10 sheets of glass substrate are mounted on a cassette and placed in the loading and unloading pre-chamber 1 through the valve 5. The substrates may be made from an inexpensive glass which can endure thermal treatment at high temperatures up to 700° C., e.g. about, 600° C. such as NO glass manufactured by Nippon Electric Glass Co. Ltd, LE-30 glass manufactured by Hoya Co. or VYCOR glass manufactured by Corning Corp. After adjusting the inner conditions of the pre-chamber 1 and the subsidiary chamber 2 to each other, the cassette is transported from the pre-chamber 1 into the subsidiary chamber 2 through the valve 6. One of the glass substrates is disposed in the first magnetron RF sputtering apparatus as shown in FIG. 7(A) by means of a transportation mechanism (not shown) and coated with a $SiO_2$ film 32 as a blocking film to a thickness of 1000 Å to 3000 Å in a 100% $O_2$ atmosphere (0.5 Pa) at a substrate temperature of 150° C. The output power of the apparatus is 400W to 800W in terms of 13.56 MHz RF energy. A single crystalline silicon or a quartz block is used as a target. The deposition speed is 30 to 100 Å/min. The coated substrate is then exchanged by another of the remaining 9 substrate which is subsequently coated with a $SiO_2$ film in the same manner. All the substrates mounted on the cassette are coated with a $SiO_2$ film by repeating this procedure. During this procedure, the transportation of a substrate between the pre-chamber 1 and the subsidiary chamber 2 has to be carried out after adjusting the pressures and the inner atmospheres of the chambers 1 and 2 to each other in order to eliminate undesirable impurities.

An amorphous silicon film 33 is next deposited in the second sputtering apparatus 4 on the $SiO_2$ film 32 to a thickness of 500 nm to 1 μm, e.g. 2000 Å. The total density of oxygen, carbon and nitrogen in the amorphous film is preferably between $4 \times 10^{19}$ to $5 \times 10^{21}$ cm$^{-3}$ in order to eliminate undesirable influence of incident light on the channel region of the transistor by reducing photosensitivity. The photosensitivity of the channel can be alternatively reduced by introducing an spoiling impurity selectively into the channel. In this case, the total density of oxygen, carbon and nitrogen it the amorphous film does desirably not exceed $7 \times 10^{20}$ cm$^{-3}$, preferably not to exceed $1 \times 10^{19}$ cm$^{-3}$. Such low density makes it easy to recrystallize the source and the drain to be formed in the silicon film in the latter step by thermal treatment. For the formation of the silicon film 33, the 10 substrates are placed into the apparatus 4 one after another from the subsidiary chamber 2 in the same manner and treated therein for deposition of the amorphous silicon film. The transportation of each substrate between the apparatus 4 and the subsidiary chamber 2 is carried out after adjusting the pressures and the inner atmospheres of the chambers 2 and 4 in order to eliminate undesirable impurities. This procedure is generally employed when it is desired to transport the substrates between the first or second sputtering apparatus and the subsidiary chamber, even if not particularly described hereinbelow. The atmosphere in the apparatus 4 comprises a mixture consisting of hydrogen and argon so that $H_2/(H_2+Ar)=0.8$ (0.2 to 0.8 in general) in terms of partial pressure. The hydrogen and argon gases have desirably purities of 99.999% and 99.99% respectively and are introduced after the inside of the apparatus 4 is evacuated to a pressure not higher than $1\times10^{-5}$ Pa. The total pressure is 0.5 Pa: the output power of the apparatus is 400W to 800W in terms of 13.56 MHz RF energy: a single crystalline silicon desirably containing oxygen atoms at a concentration of no higher than $5\times10^8$ cm$^{-3}$, e.g. $1\times10^8$ cm$^{-3}$ is used as a target: and the substrate temperature is maintained at 150° C. (deposition temperature) by the heater 16a in the same manner. In preferred embodiments, the hydrogen proportion in the mixture may be chosen between 5% and 100%; the deposition temperature between 50° C. and 500° C., e.g. 150° C.; the output power between 1W and 10MW in a frequency range from 500 Hz to 100 GHz which may be combined with another pulse energy source.

Alternatively, the amorphous silicon film 33 may be deposited by low pressure CVD (LPCVD) or plasma CVD. In the case of LPCVD, the deposition is carried out by introducing disilane ($Si_2H_6$) or trisilane ($Si_3H_6$) in a suitable CVD chamber. The deposition temperature is selected at a temperature 100° C. to 200° C. lower than the recrystallization temperature of the silicon, i.e. 450° C. to 550° C., for example 530° C. The deposition speed is 50 to 200 Å/min. Boron may be introduced at $1\times10^{15}$ cm$^{-3}$ to $1\times10^{10}$ cm$^{-8}$ into the film by using diboran as a dopant gas together with the silane in order to make even the threshold voltages of N-type and P-type TFTs. In the case of plasma CVD, the deposition is carried out by introducing monosilane ($SiH_4$) or disilane ($Si_2H_6$) at 300° C. in a suitable plasma CVD chamber. The input energy is for example high frequency electric energy at 13.56 MHz.

The oxygen desity of the semiconductor film is preferably no higher than $5\times10^{21}$ cm$^{-3}$ because if the oxygen density is too high, thermal treatment have to be carried out at a high temperature for a long time in order to sufficienty recrystallize the semiconductor film in a latter step. The oxygen density, however, must not be too low because leak current in the off condition of the TFT increases in response to a back light which may be provided in the liquid crystal display if particular spoiling impurity is not used. For this reason, the oxygen density is selected between $4\times10^{19}$ to $4\times10^{21}$ cm$^{-3}$. In accordance with experiments, it was confirmed by SIMS (secondary ion mass spectroscopy analysis) that hydrogen was involved at densities of $4\times10^{20}$ cm$^{-3}$ equivalent to one atom % assuming the density of silicon being $4\times10^{22}$ cm$^{-3}$. These figures of density were minimum values of the respective elements which varied along the depth direction. The reason why such minimum values were employed is that a natural oxide existed at the surface of the semiconductor film. If it is desired to spoil the channel region, oxygen may be introduced as a spoiling agent to a portion of the semiconductor film to be a channel region to a density of $5\times10^{19}$ to $5\times10^{21}$ cm$^{-3}$ after deposition of tile semiconductor film. In this case, the deposition of the semiconductor film cab be carried out in order that the total density of oxygen in the semiconductor film does not exceed $7\times10^{20}$ cm$^{-3}$, preferably not to exceed $1\times10^{19}$ cm$^{-3}$. Such low density makes it easy to recrystallize the source and drain regions of the semiconductor film in the latter step by thermal treatment. In this case, when TFTs for peripheral circuits located not to be exposed to illumination are formed in the same time, the mobility of the TFTs can be increased, because the oxygen introduction is prevented, resulting in a high speed operation.

After all the substrates are coated with the silicon oxide and amorphous silicon semiconductor films, thermal treatment is given thereto in the subsidiary chamber 2 by means of the heater 10c at 450° C. to 700° C., typically at 600° C. for 12 to 70 hours in a non-oxidizing atmosphere, e.g. in hydrogen by means of the heater. The film is recrystallized by this thermal annealing in the form of semi-amorphous or semi-crystalline structure.

Next, the mechanism of formation of semi-amorphous or semi-crystalline semiconductor material in accordance with the present invention will be explained. When sputtering a single crystalline silicon target in a mixture of hydrogen and argon, high energy heavy argon atoms collide with the surface of the target, dislodge therefrom clusters each consisting of several tens to several hundred thousands of silicon atoms, and deposit the clusters on a substrate to be coated. These clusters pass through the mixture gas in advance of the deposition on the substrate and are coupled with hydrogen atoms at their external surfaces in order to terminate their dangling bonds. Accordingly, when deposited on the substrate, the clusters comprise internal amorphous silicon and external ordered silicon including Si—H bonds. The Si—H bonds react with other Si—H bonds and are converted to Si—Si bonds by thermal treatment at 450° C. to 700° C. in a non-oxidizing atmosphere. These coupling of adjacent silicon atoms (Si—Si) function to let adjacent clusters be attracted to each other whereas these clusters have a tendency to convert their phases to more ordered phases (partial recrystallization). As a result, the crystalline structure of these clusters is given lattice distortion and the peak of its Raman spectra (522 cm$^{-1}$: the peak of single crystalline silicon) is displaced to the low frequency direction. The apparent grain diameter calculated based on the half-width is 50 to 500 Å which seems to indicate microcrystals.

The energy bands of the clusters are connected through the Si—Si bonds anchoring the clusters at the interfaces therebetween. For this reason, the polycrystalline (semi-amorphous or semi-crystalline) structure of silicon in accordance with the present invention is entirely different than usual polycrystals in which grain boundaries provide barriers against carrier transportation, so that the carrier mobility can be on the order of 15 to 300 cm$^2$/Vsec (electron mobility) and 10 to 200 cm$^2$/Vsec (hole mobility). Namely, the semi-amorphous or semi-crystalline structure in accordance with the present invention can be considered substantially not to include undesirable grain boundaries. Of course, if the semiconductor is subjected to high temperatures of 1000° C. or higher rather than the relatively low temperatures of 450° C. to 700° C., latent oxygen atoms come to appear at the boundaries between the clusters and form barriers like the prior art technique. The carrier mobility can be improved by increasing the strength of the anchoring. For this purpose, the oxygen density in the semiconductor film is decreased to $7\times10^{19}$ cm$^{-3}$, desirably to $1\times10^{10}$ cm$^{-3}$.

The amorphous silicon semiconductor film 33 is patterned by means of a photomask as indicated by ① to leave areas 33 and 33' which are necessary to form N-channel and P-channel transistors. After all the substrates are coated with the silicon oxide and amorphous silicon semiconductor films and patterned as described above, the substrates are placed again in the first sputtering apparatus 3. The entire structure is then coated with a silicon oxide film 35 of a thickness of 500 Å to 2000 Å, e.g. 1000 Å by sputtering in an oxide atmosphere as illustrated in FIG. 8(B). The deposition condition is same as that of the silicon oxide film 32 explained above. The characteristics at the interface between the silicon oxide film 35 and the underlying semiconductor film 36 can be improved by applying ultraviolet rays to carry out ozone oxidation. Namely, the boundary levels can be decreased by utilizing photo-CVD in combination with the sputtering explained in the description of deposition of the oxide film 32. Alternatively, fluorine may be introduced in this deposition in order to fix sodium ions. In this case, the atmosphere comprises a high density oxygen (95%) including $NF_3$ (5%) at a total pressure of 0.5 Pa: the output power of the apparatus is 400W in terms of 13.56 MHz RF energy: a single crystalline silicon or an artificial quartz is used as a target: and the substrate temperature is maintained at 100° C. By this procedure, the silicon oxide film 35 to be a gate insulating film includes fluorine atoms which function to terminate dangling bonds of silicon atoms so that the formation of fixed charge can be prevented at the interface between the semiconductor films 33 and 33' and the oxide film 35. On the silicon oxide film 35 is deposited by low pressure CVD a silicon semiconductor film of 0.2 $\mu$m thickness which is highly doped with phosphorus at $1\times10^{21}$ to $5\times10^{21}$ cm$^{-3}$ followed, if desired, by coating a conductive film of 0.3 $\mu$m thickness made of molybdenum, tungsten film or a multiple film consisting of it and a $MoSiO_2$ or $WSiO_2$ film. The semiconductor film coated with the conductive (multiple) film is then patterned by photolithography with a suitable mask ② in order to form gate electrodes 40 and 40'.

A photoresist film 27' is formed by the use of a photomask ③ in order to cover the semiconductor film 33'. With the gate electrode 40 and the photomask ③, self-aligned impurity regions, i.e. a source and a drain region 34a and 34b are formed by ion implantation of boron at $1\times10^{15}$ cm$^{-2}$ to $5\times10^{15}$ cm$^{-2}$. The intermediate region 28 of the silicon semiconductor film 33 between the impurity regions 34a and 34b is then defined as a channel region as illustrated in FIG. 3(C). After removing the photoresist film 27', another photoresist film 27 is formed by the use of a photomask ④ in order to cover the semiconductor film 33. With the gate electrode 40' and the photomask ④, self-aligned impurity regions, i.e. a source and a drain region 34a' and 34b' are formed by ion implantation of of phosphorus at $1\times10^{15}$ cm$^{-2}$ to $5\times10^{15}$ cm$^{-2}$. The intermediate region 28' of the silicon semiconductor film 33 between the impurity regions 34a' and 34b' is then defined as a channel region as illustrated in FIG. 8(D). The channel lengths of the p-channel and n-channel transistor are 10 $\mu$m respectively. The channel widths of the p-channel and n-channel transistor are 20 $\mu$m respectively. The ion implantation may instead be carried out by selectively removing the silicon oxide film 35 by the use of the gate electrode 40 or 40' as a mask followed by direct ion implantation of boron or phosphorus.

After removing photoresist 27, the channel regions are then thermally annealed at 600° C. for 10 to 50 hours in $H_2$ atmosphere to make active the impurities in the drain and source regions. An interlayer insulating film 37 of silicon oxide is deposited to a thickness of 0.2 to 0.6 $\mu$m by the same sputtering method as described above over the entire surface of the structure followed by etching by means of a photomask ⑤ for opening contact holes 39 through the interlayer film 37 and the oxide film 35 in order to provide accesses to the underlying source and drain regions 34a, 34b, 34a' and 34b'. The deposition of the interlayer insulating film 37 may be carried out by LPCVD, photo-CVD, ordinal pressure CVD (TEOS-ozone). Next, an aluminum film of 0.5 to 1 $\mu$m thickness is deposited on the structure over the contact holes 39 and patterned to form source and drain electrodes 36a, 36b, 36a' and 36b' by means of a photomask ⑥ as illustrated in FIG. 8(F). An organic resin film 39 such as a transparent polyimide film is coated over the structure to provide a plan surface and patterned by means of a photomask ⑦ to provide accesses to the drain electrodes 36b and 36b' followed by formation of lead electrode 37 made of a transparent conductive material such as indium tin oxide (ITO) to be electrically connected with the pad 37b. The ITO film is deposited by sputtering at room temperature to 150° C. followed by annealing in an oxidizing atmosphere ($O_2$) or in air at 200 to 400° C. The pad 37b can be formed at the same time by the deposition of the lead electrode 37. Then, the formation of CMOS transistors is finished. The mobility, the threshold voltage of the p-channel TFT are 20 cm$^2$/Vs and −5.9 V. The mobility, the threshold voltage of the n-channel TFT are 40 cm$^2$/Vs and 5.0 V. The glass substrate thus provided with these CMOS transistors and suitable conductive patterns as illustrated is joined with a counterpart glass substrate provided with a ground electrode at its entire inner surface followed by injection of a liquid crystal material between the two substrate. One of the advantages of the above process is that the formation of these transistors (spoiled and not spoiled) can be carried out at temperatures no higher than 700° C. so that the process does not require the use of expensive substrates such as quartz substrates and therefore suitable for large scale liquid crystal displays production methods.

Figure 8A:
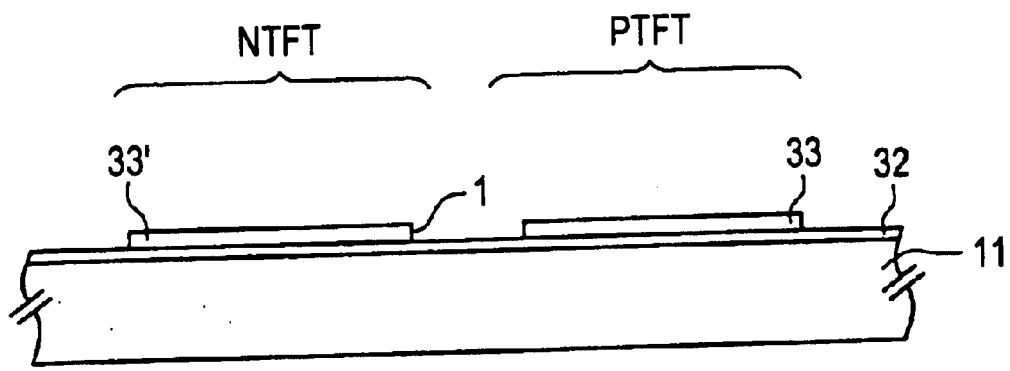
FIGS. 8(A) to 8(F) are cross sectional views showing a method of manufacturing thin film field effect semiconductor transistors suitable for the first embodiment of the present invention.
Figure 8B:
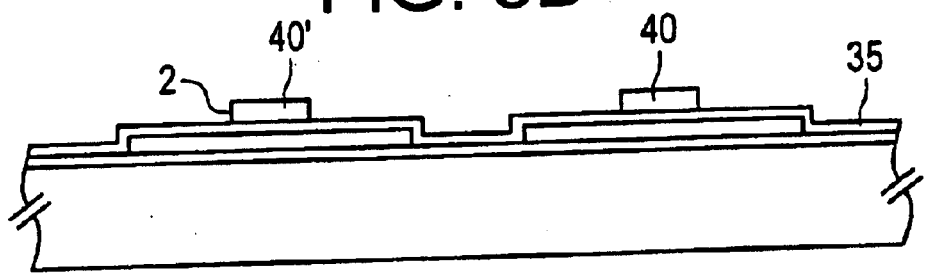
Figure 8C:
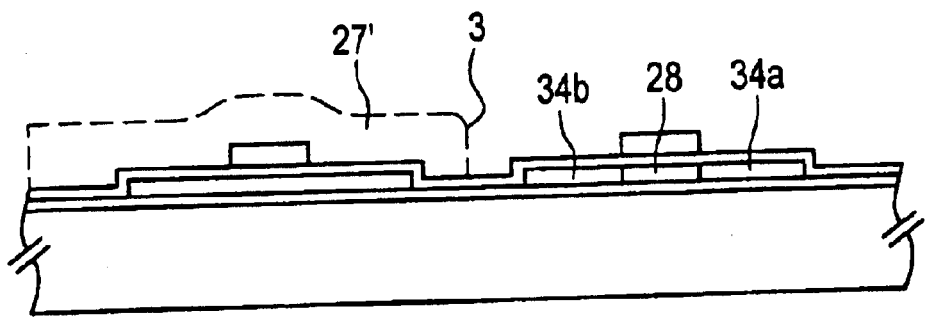
Figure 8D:
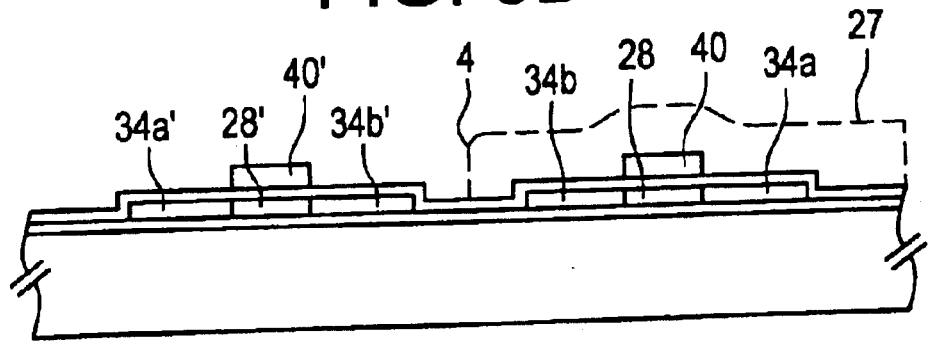
Figure 8E:
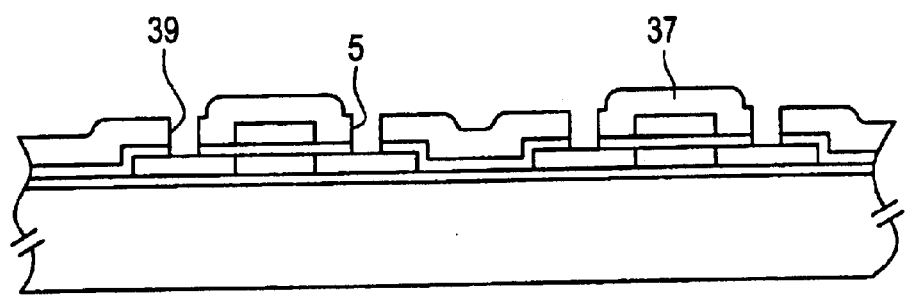
Figure 8F:
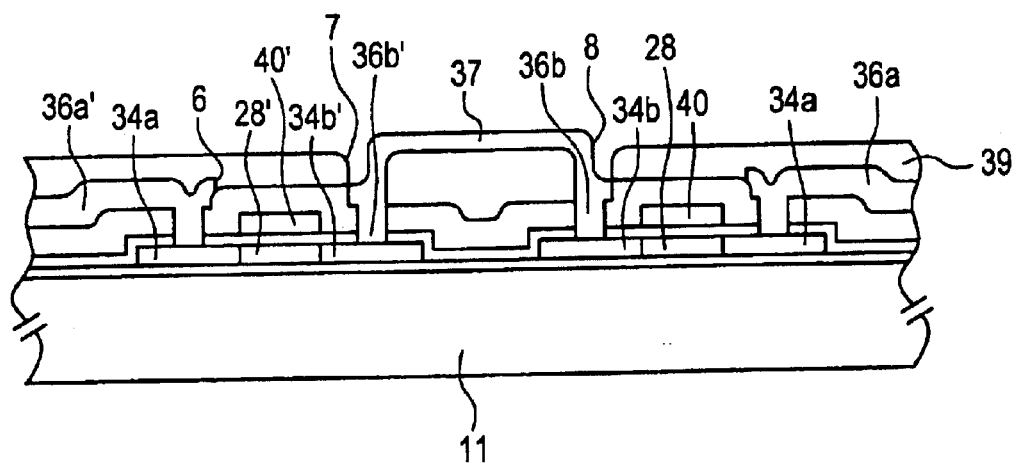

In the above embodiment, thermal annealing is carried out twice at the steps corresponding to FIGS. 8(A) and 8(D). The first annealing (FIG. 8(A)) however, can be omitted to shorten the process time in the light of the second annealing.

Figure 9A:
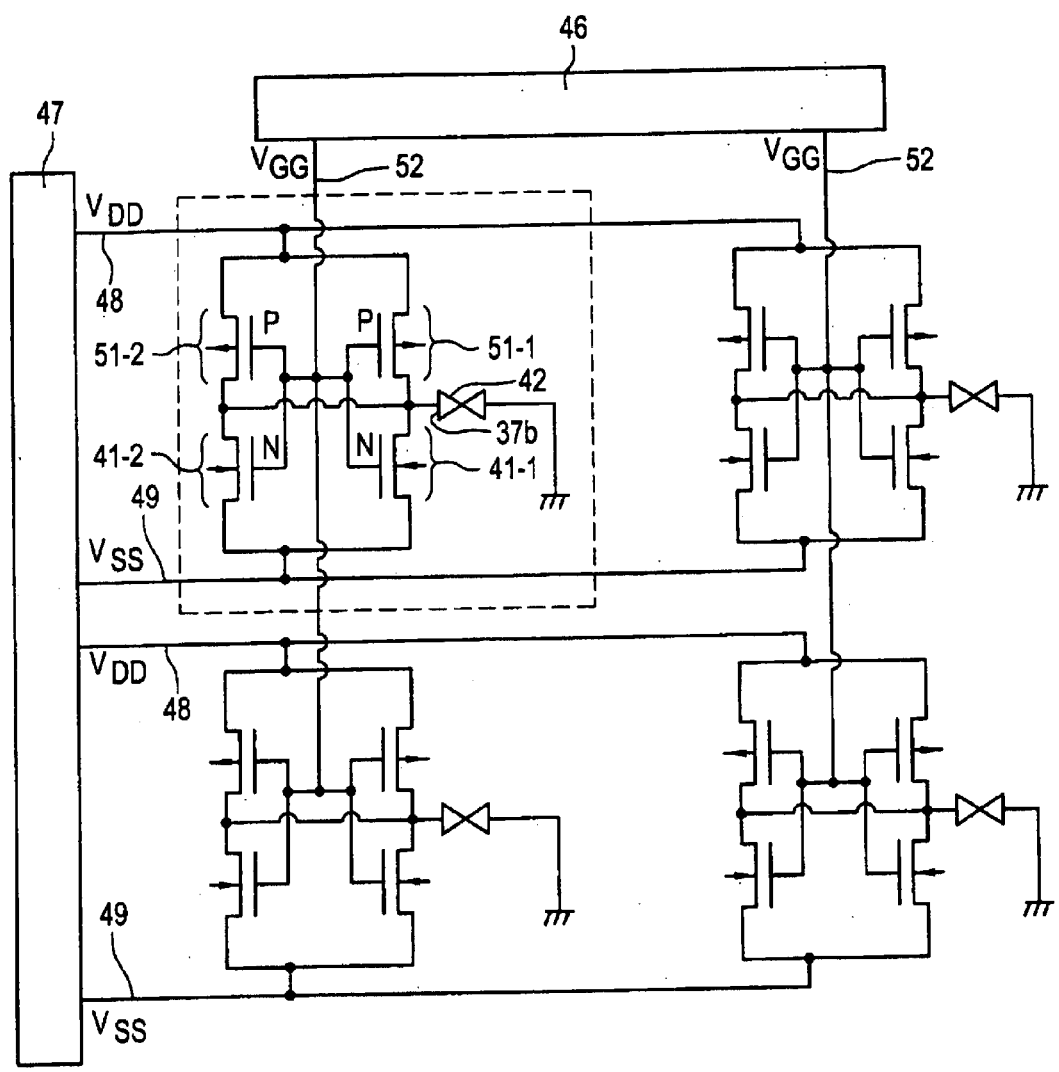
FIG. 9(A) is a schematic diagram showing an equivalent circuit of a liquid crystal display in accordance with a second embodiment of the present invention.
Figure 9B:
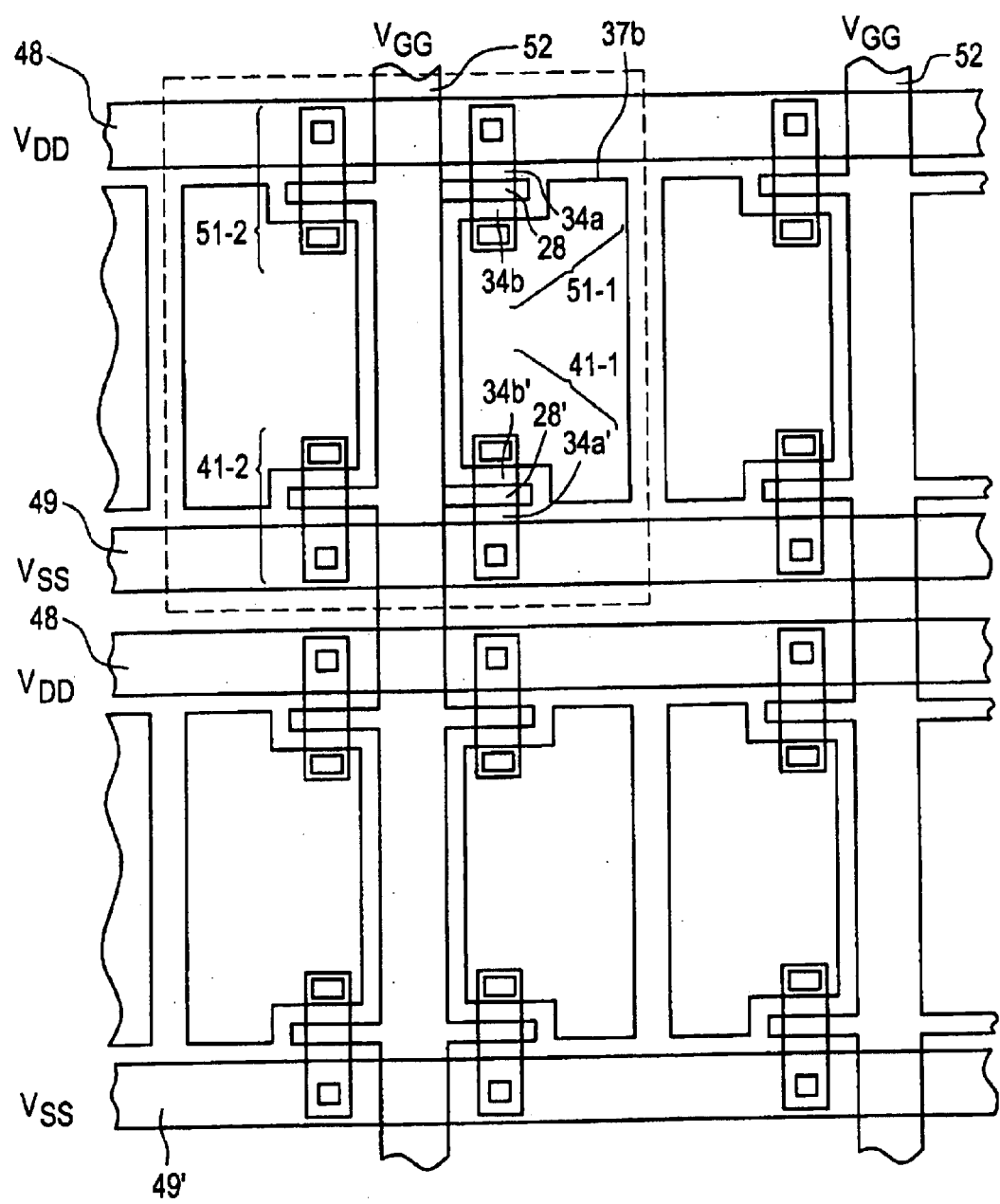
FIG. 9(B) is a plan sectional view showing the liquid crystal display illustrated in FIG. 9(A).

Referring to FIGS. 9(A) and 9(B), CMOS thin film field effect transistors in accordance with a second preferred embodiment of the present invention will be illustrated. In this embodiment, two couples of CMOS transistors 51-1, 41-1, 51-2 and 51-2 are connected in parallel to the conductive pad 37b for each pixel (as enclosed by dashed line) at their drain electrodes. These CMOS transistors are manufactured in the steps explained above in conjunction with the first embodiment except that the number of the transistors is doubled. The similar elements are given similar numerals as in the first embodiment. The electrode pads 37b have to be deposited on the $V_{GG}$ line through a suitable insulating film. The electrical operation is substantially same as that of the first embodiment. Accordingly, two identical individual switching elements are prepared corresponding to one pixel so that when the operation of one of them is fault, the ability of information display can be maintained by firing the fault element by laser rays in virtue of the remaining CMOS transistors. For this reason, the conductive transparent pads are formed in order not to cover these TFTs.

Figure 10A:
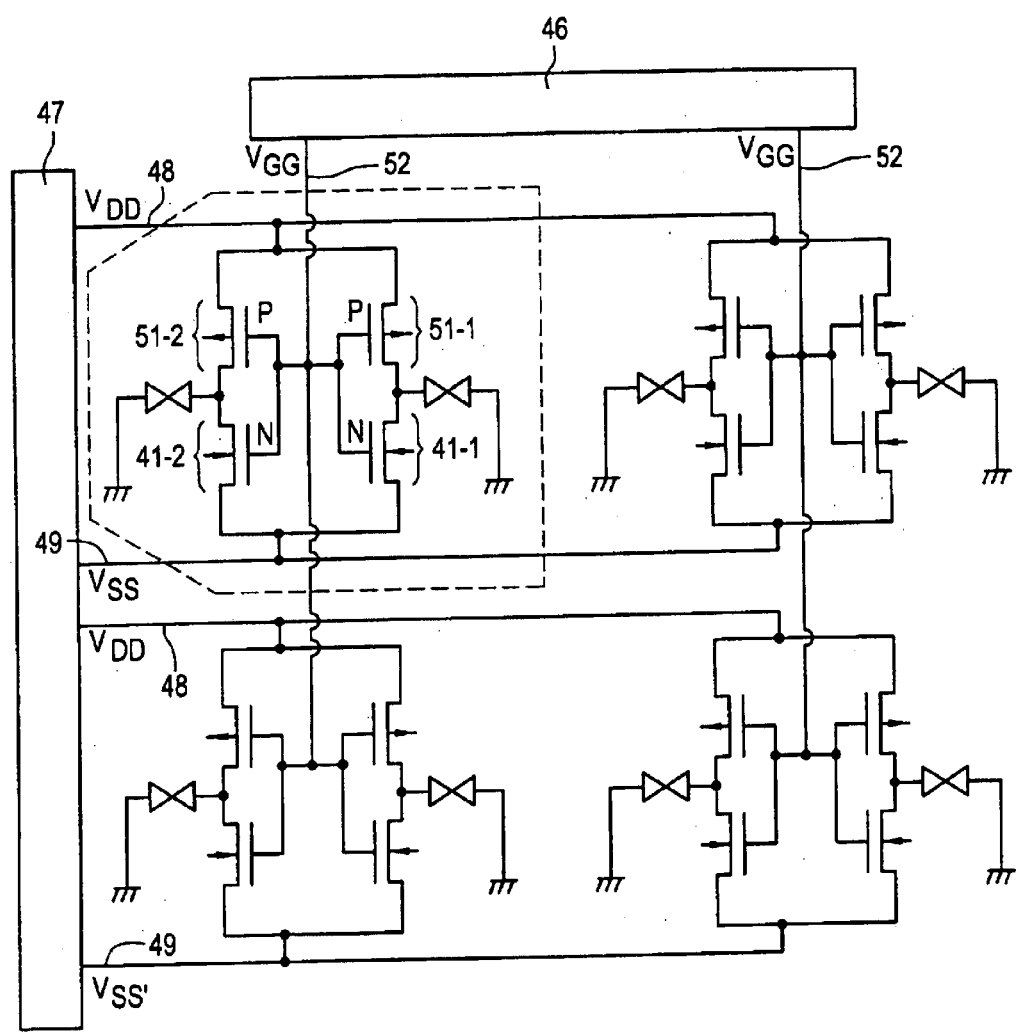
FIG. 10(A) is a schematic diagram showing an equivalent circuit of a liquid crystal display in accordance with a third embodiment of the present invention.
Figure 10B:
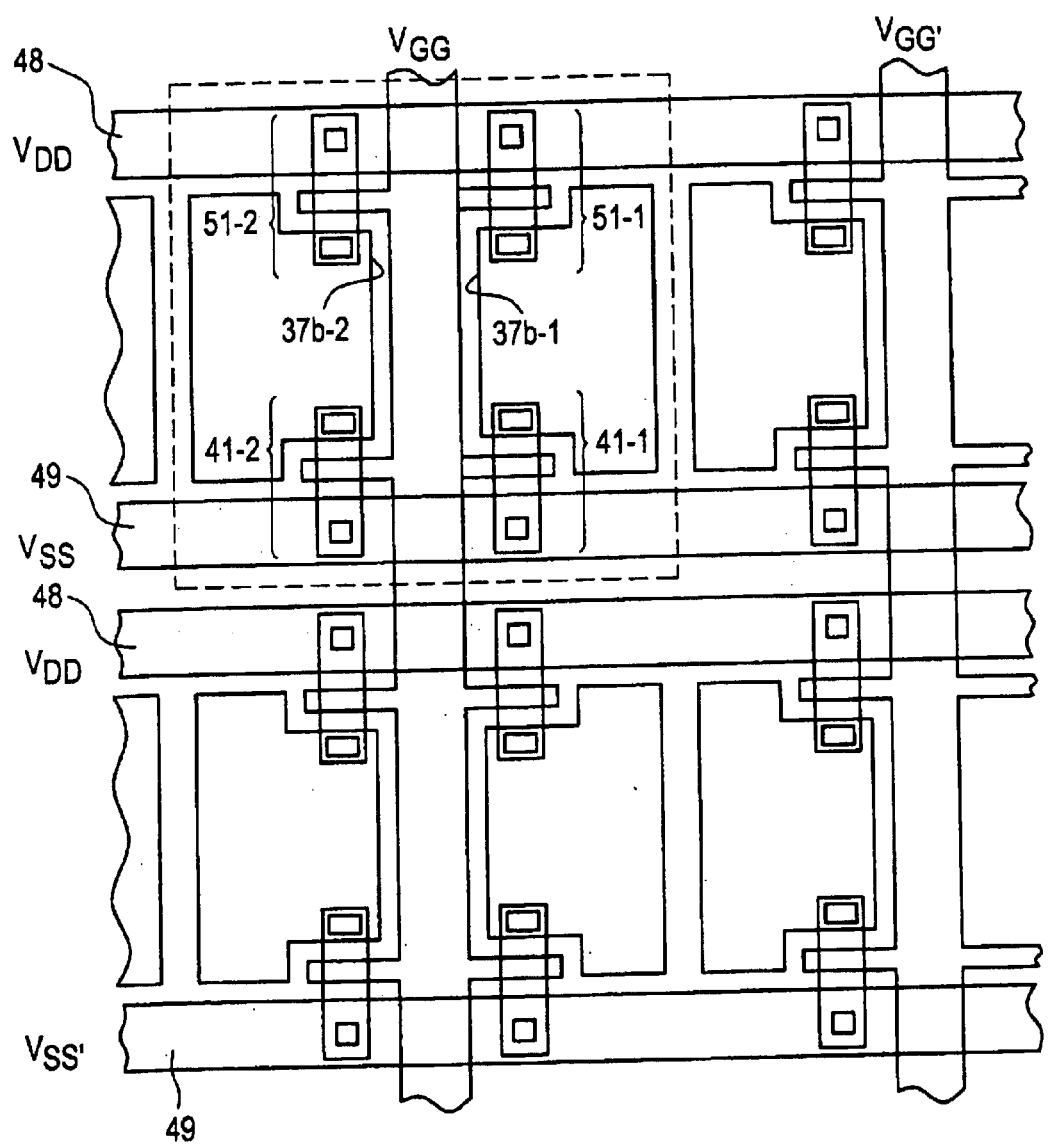
FIG. 10(B) is a plan sectional view showing the liquid crystal display illustrated in FIG. 10(A).

Referring to FIGS. 10(A) and 10(B), CMOS thin film field effect transistors in accordance with a third preferred embodiment of the present invention will be illustrated. Also in this embodiment, two couples of CMOS transistors 51-1, 41-1 and 51-2 and 41-2 are connected in parallel to an electrode pad 37b for each pixel at their drain electrodes. The electrode pad 37b, however, is separated into two portions 37b-1 and 37b-2 each independently connected to a corresponding one of the two CMOS transistors. These CMOS transistors are manufactured in the steps explained above in conjunction with the first embodiment except for the number of the transistors. The similar elements are given similar numerals as in the first embodiment. Then, each pixel comprises two individual sub-pixels. In accordance with this embodiment, even if the operation of one of the sub-pixels is fault, the other sub-pixel can support the operation of the pixel and therefore the deterioration of grey scales is substantially decreased.

As described above, there are following advantages in accordance with the above embodiments of the present invention:

1) Definite threshold voltages are established.
2) The switching speeds are increased.
3) Margins for operational fluctuation are broadened.
4) Even if some TFTs are fault, the operation thereof is followed up to same extent.

5) The increase of the number of photomasks due to the employment of complimentary transistors is only two (photomask ③ and ④) as compared with conventional cases utilizing only n-channel TFTs.

6) Since semi-amorphous or semi-crystalline semiconductors are used in place of amorphous semiconductors and the carrier mobility is increased by a factor of ten or more, the size of the TFT is substantially reduced so that little decrease of the aperture ratio is necessary even when two TFTs are formed in one pixel.

Figure 4B:
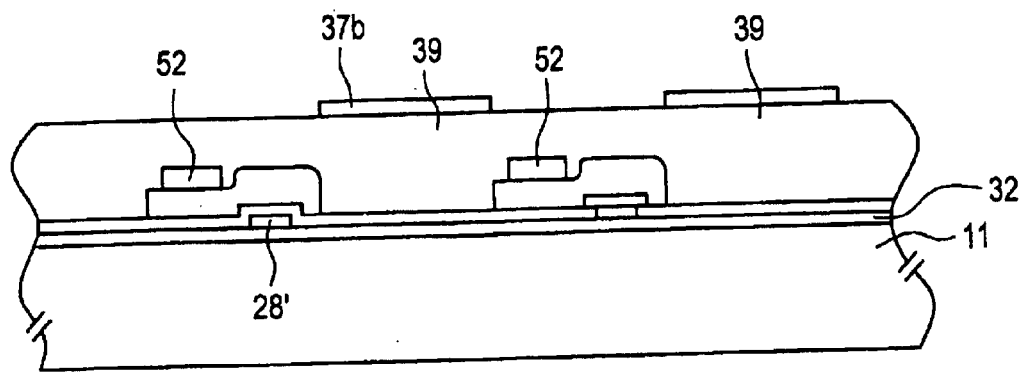
Figure 4C:
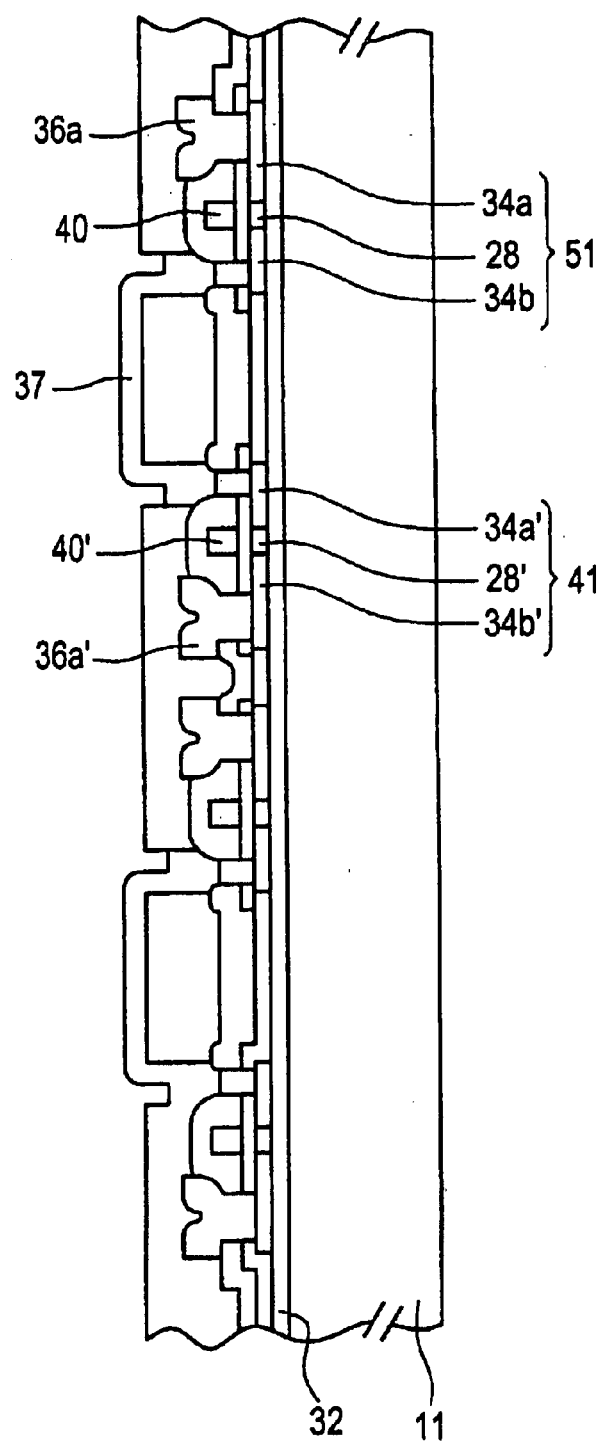
Figure 11:
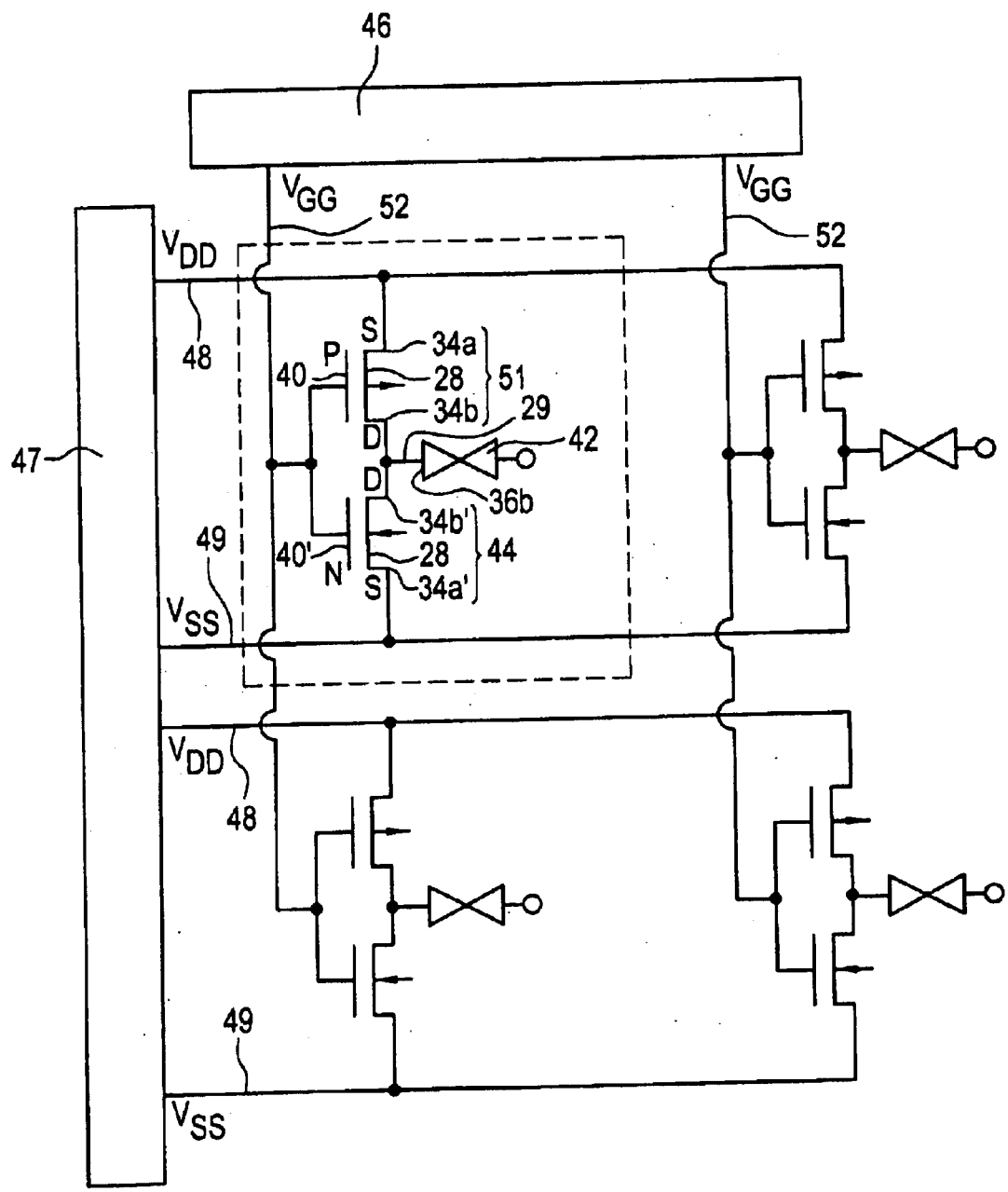
FIG. 11 is a schematic diagram showing an equivalent circuit of a liquid crystal display in accordance with a fourth embodiment of the present invention.

FIG. 11 is a diagram illustrating the equivalent circuit of a liquid crystal display in accordance with a fourth embodiment of the present invention. The pixel configuration as shown in FIG. 4 can be applied also for this embodiment. The diagram shows only a 2×2 matrix for the sake of convenience in description whereas ordinary liquid crystal displays consist of more great numbers of pixels such as a 640×480 matrix, a 1260×960 matrix. The liquid, crystal display includes a liquid crystal layer 42 disposed between a pair of glass substrates 11 and 11' in the same manner as the first embodiment as shown in FIG. 2. The entirety of the inner surface of the glass substrate 11' is coated with a back electrode 53. In this embodiment, however, the electrode 53 is not ground but supplied with an offset voltage in accordance with the driving mechanism of the liquid crystal display as detailedly explained infra. The inner surface of the other substrate 11 is provided with a plurality of conductive pads 37b each constituting one pixel of the display in the same manner as the first embodiment. Each conductive pad 37b are formed on the substrate together with CMOS transistors consisting of an N-type FET 41 and a P-type FET 51 whose drains 34b' and 34b are electrically connected with the corresponding pad 37b. The sources of the P-type FETs of the CMOSs on a similar row are connected with a $V_{DD}$ line 48 of the row. The sources of the N-type FETs of the CMOSs on a similar row are connected with a VSS line 49 of the row. The gates of the P-type and N-type FETs of the CMOSs on a similar column is connected with a $V_{GG}$ line of the column. The VSS lines and the $V_{DD}$ lines are connected with a row driver 47 and supplied with control signal therefrom. The $V_{GG}$ lines 52 are connected with a column driver 46 and supplied with control signal therefrom.

Figure 12:
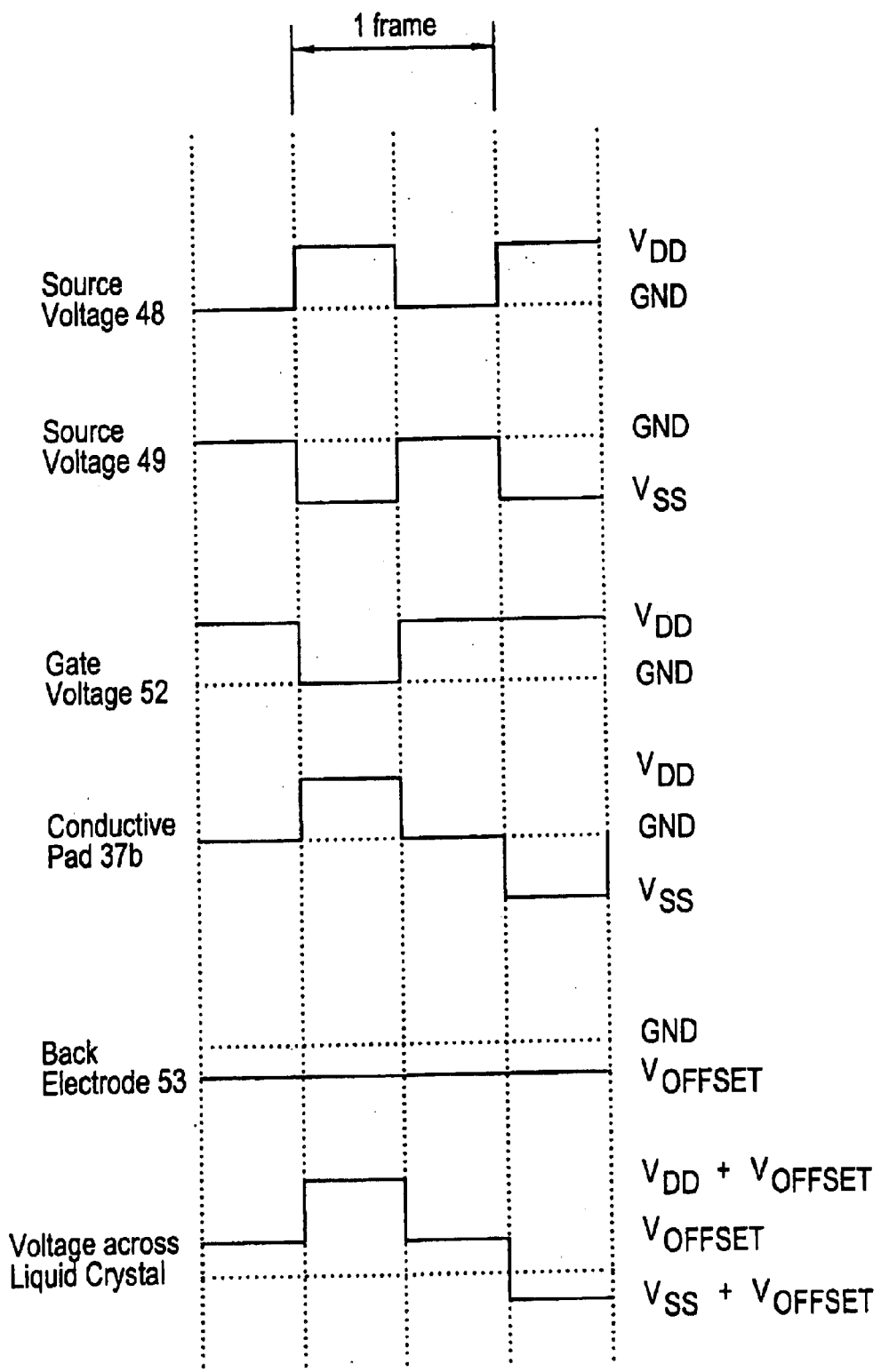
FIG. 12 is an explanatory diagram demonstrating operation of the complimentary transistors of the liquid crystal display in accordance with the fourth embodiment.

FIG. 12 illustrates operational action of each pixel in response to several control signals applied to the $V_{DD}$ line, the $V_{SS}$ line, the $V_{GG}$ line and the back electrode. When a positive voltage is applied to the $V_{DD}$ line and a negative voltage to the $V_{SS}$ line, the liquid crystal voltage level at the pixel. (i.e. the voltage level of the pad 37b) is pulled up to the $V_{DD}$ level if the $V_{GG}$ line is ground and the liquid crystal voltage level is pushed down to the VSS level if the $V_{GG}$ line is positive (e.g. the VDD level) Accordingly, the voltage applied between the liquid crystal at the pixel is calculated by subtracting the offset (bias) voltage applied to the back electrode from the liquid crystal voltage. In the illustration, a highest voltage is applied between the liquid crystal layer only when the positive voltage ($V_{DD}$) and the negative voltage (VSS) are applied respectively to the $V_{DD}$ line and the $V_{SG}$ line and the $V_{GG}$ line is ground.

Figure 13:
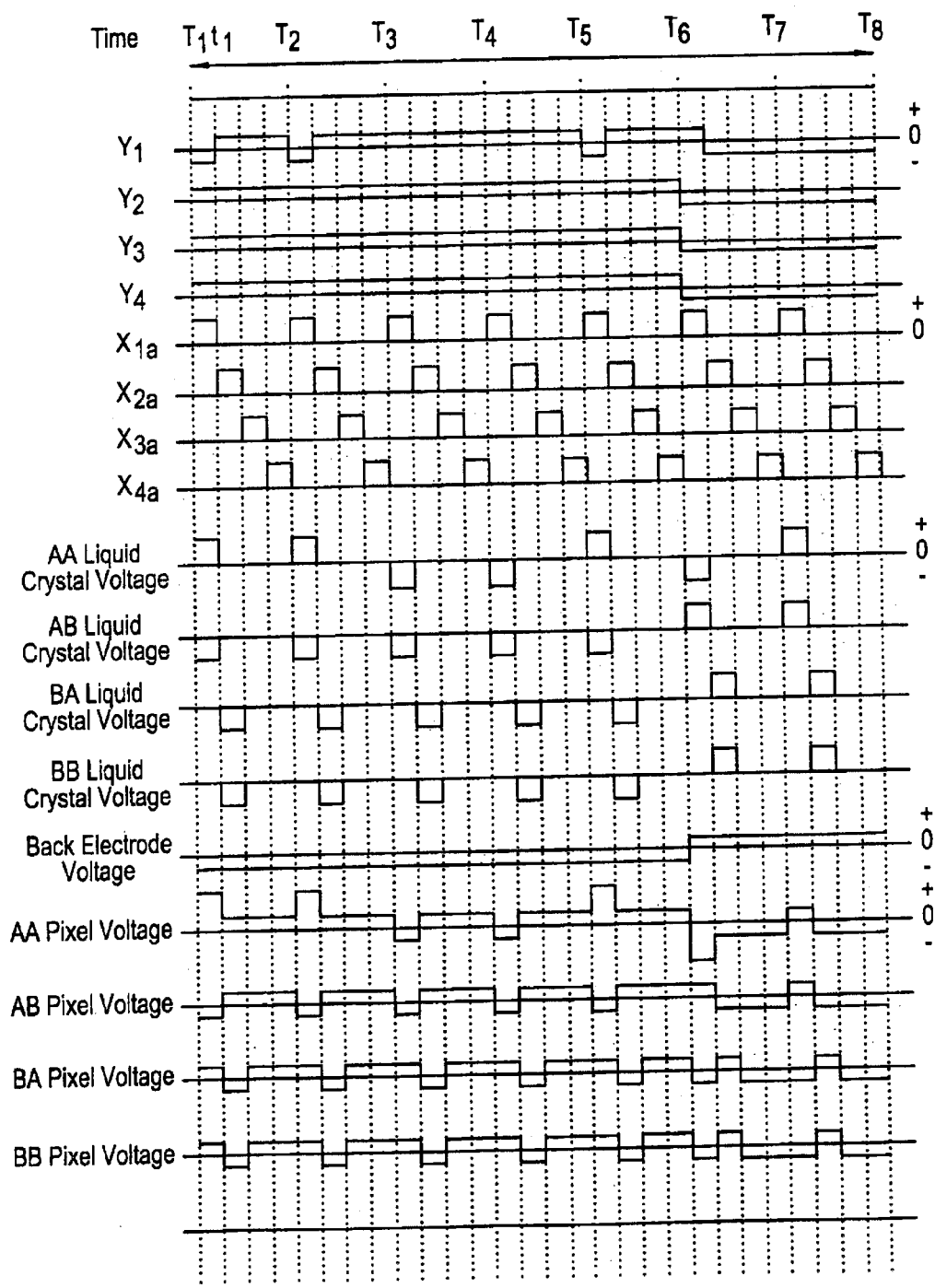
FIG. 13 is an chlonological diagram demonstrating operation of the liquid crystal display in accordance with the fourth embodiment.
Figure 14:
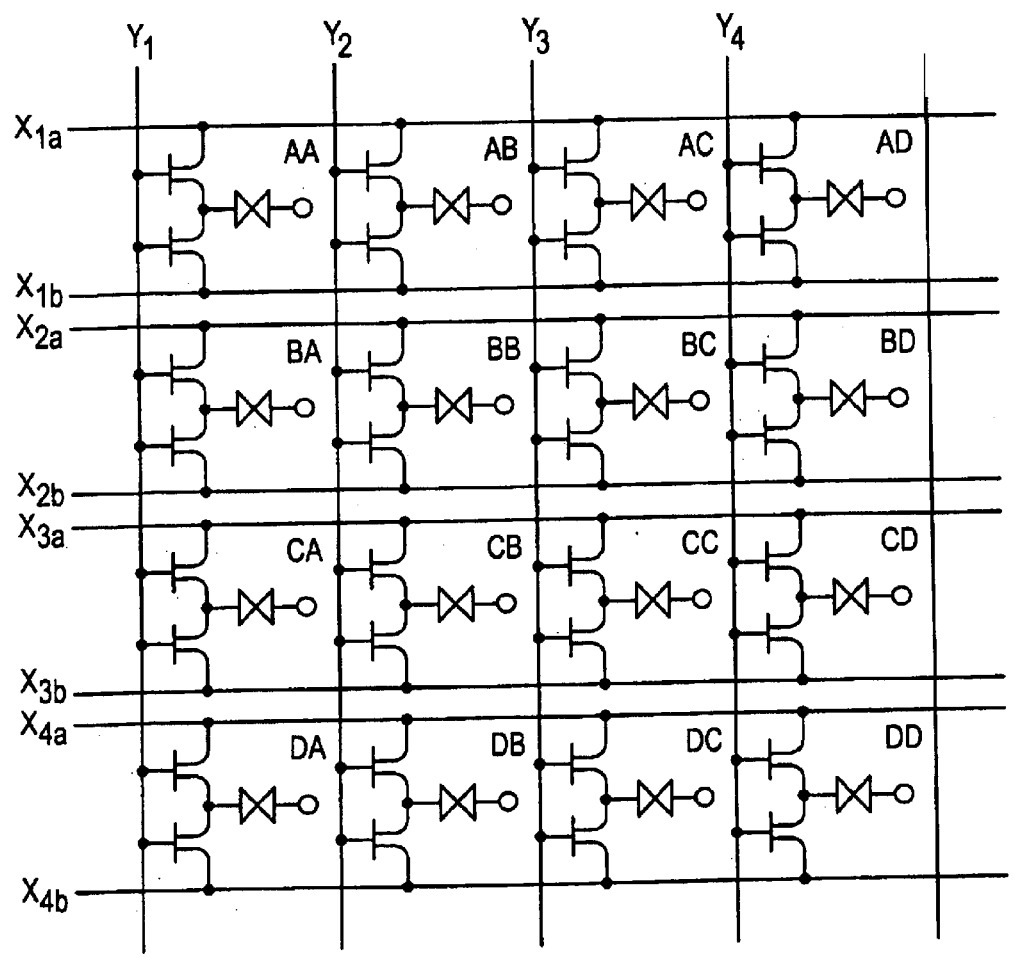
FIG. 14 is a schematic diagram showing an equivalent circuit of a liquid crystal display corresponding to FIG. 13 in accordance with the fourth embodiment of the present invention.

The representative example of the driving method in accordance with the fourth embodiment of the present invention will be explained with reference to FIGS. 13 and 14. In FIG. 14, the 2×2 matrix of FIG. 11 is expanded to a 4×4 matrix. The configurations of them, however, are substantially indentical except the number of pixels. FIG. 13 illustrates the control signals applied to the $V_{DD}$ lines, the $V_{SS}$ lines, the $V_{GG}$ lines and the back electrode. The $V_{DD}$ lines are called $X_{1a}, X_{2a}, X_{3a}$ and $X_{4a}$ from the first row to the forth row in the diagram whereas the VSS lines are called $X_{1b}, X_{2b}, X_{3b}$ and $X_{4b}$ in the same manner. The signals applied to the VSS lines are exactly the inversion of the signals to the $V_{DD}$ line as shown in FIG. 12 and therefore the waveforms of the VSS lines are dispensed with. The $V_{GG}$ lines are called $Y_1, Y_2, Y_3$ and $Y_4$ from the left column to the right column. In this driving method, the control signals applied to the $V_{DD}$ and VSS lines are addressing signals which scan from the first row to the forth row as shown in FIG. 13. Opposed pulses are applied to the $V_{DD}$ and VSS lines connected to one addressed row for the time width of one fourth of the frame during which all the rows are sequentially scanned. The control signals applied to the $V_{GG}$ lines are data signals which determine the visual pattern appearing on the display.

If a pixel on the i-th row and the j-th column is desired to be actuated, a negative pulse is applied to the $V_{GG}$ line of the j-th column at the time when the i-th row is addressed by applying opposed pulses to the VDD and VSS lines on the i-th row. In FIG. 13, the pixel on the first column and the first row (given symbol AA in FIG. 14) is actuated in the first fourth of the first frame between $T_1$ and $T_2$, the second frame between $T_2$ and $T_3$ and the fifth frame between $T_5$ and $T_6$. The back electrode is biassed by a negative voltage between $T_1$ and $T_6$. The $V_{DD}$, VSS and $V_{GG}$ signal levels and the bias voltage are for example 20V, −20V, $^1$10V and $^1$10V respectively in the case that the optical characteristic of the liquid crystal is changed by the threshold voltage of 20V thereacross. Accordingly, as understood from FIG. 12, such a high voltage as 30V is applied only to the selected pixel (the AA pixel in the figure) while the voltage level applied to the other pixel can not exceed 10V. In $T_6$ to $T_8$ in FIG. 13, the voltage levels at the $V_{GG}$ lines and the back electrode are inversed so that the sign of the applied voltage on each pixel is simply inversed. Accordingly, such a low voltage as −30V is applied only to the selected pixel (the AA pixel in the figure) while the absolute voltage level applied to the other pixel can not exceed 10V. The pixel on the first column and the first row is actuated in the sixth frame between $T_6$ and $T_7$. The inversion of the signs takes place repeatedly once per several frames to several tens of frames so that the average voltage applied to the liquid crystal approaches to zero throughout the operation resulting in effective prevention of deterioration of the liquid crystal. In the case that the threshold voltage of the liquid crystal is 2.5 V, the signal levels of these VDD, VSS and VGG lines are selected respectively to be 5V, −5V and $^1$7V.

In accordance with this embodiment, the voltage level of control signals applied to the liquid crystal layer can be easily adjusted to the threshold level of the liquid crystal layer only by adjusting the bias voltage level applied to the back electrode. The employment of the bias voltage makes it possible to cancel out the effect of the electric field impressed on the liquid crystal by periodically changing the polarity of the bias voltage, resulting in the prevention of electrolysis of the liquid crystal material.

Figure 15:
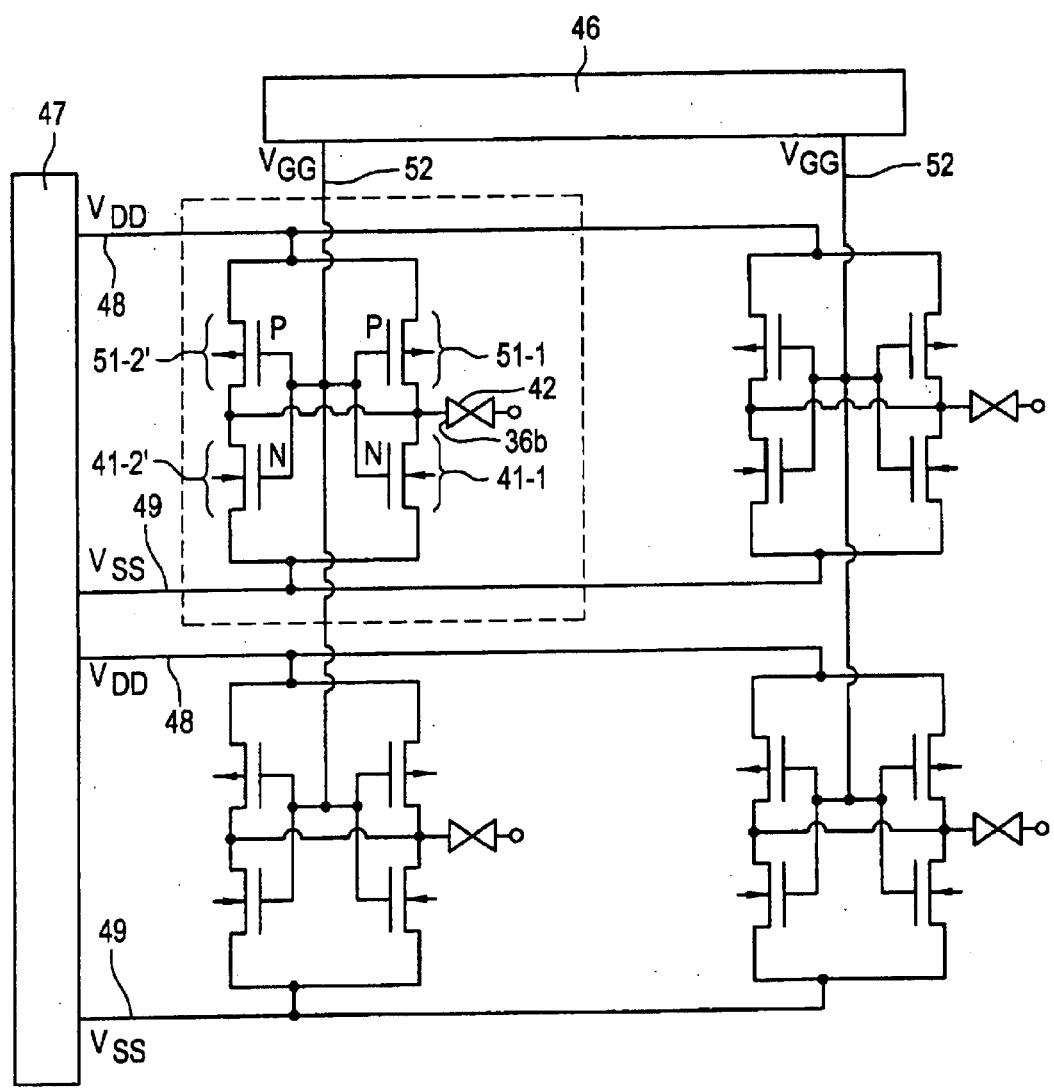
FIG. 15 is a schematic diagram showing an equivalent circuit of a liquid crystal display in accordance with a fifth embodiment of the present invention.
Figure 16:
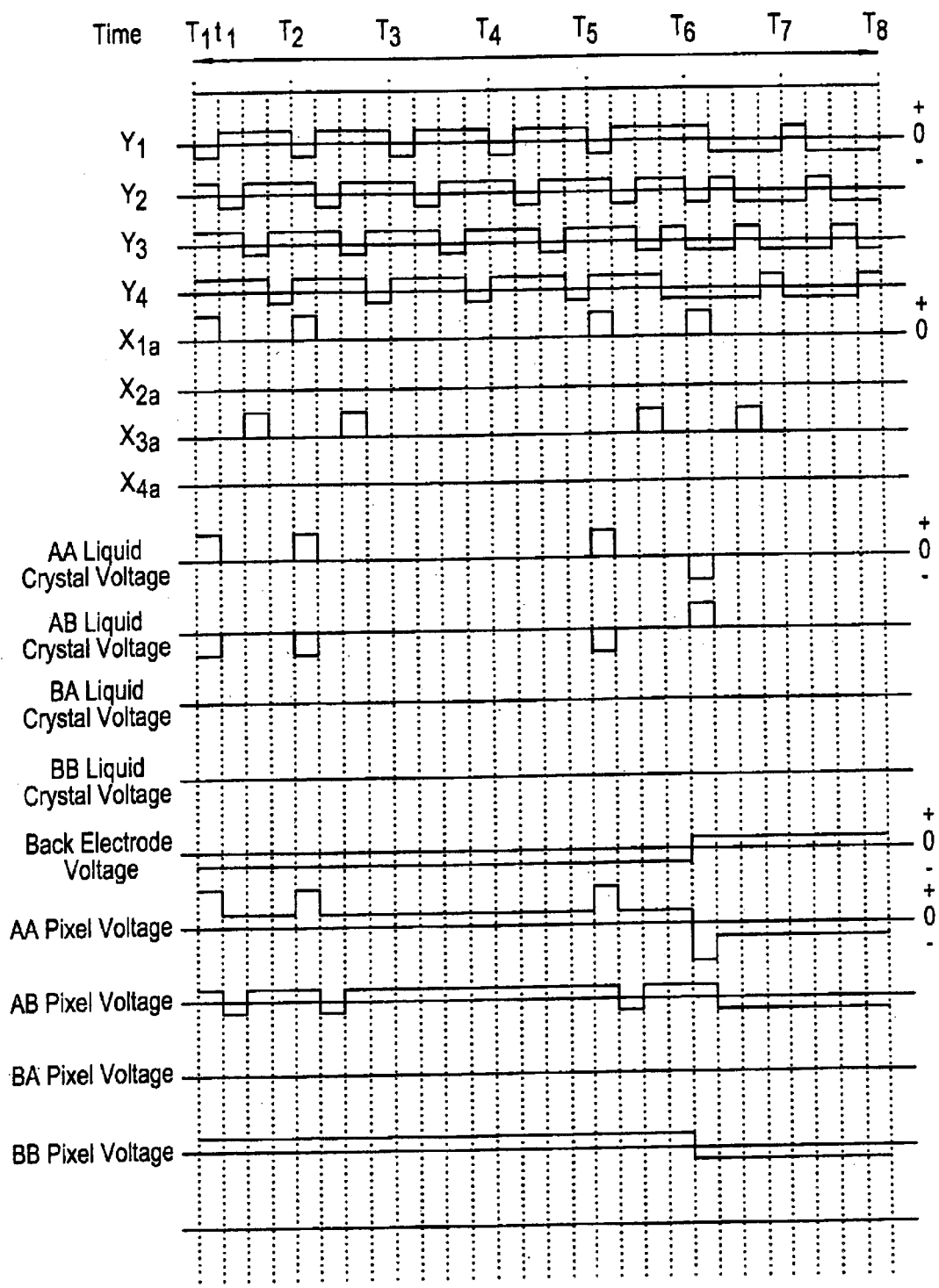
FIG. 16 is a chlonological diagram demonstrating operation of the liquid crystal display in accordance with the fifth embodiment.

Referring to FIGS. 15 and 16, a liquid crystal display and a method for driving the display in accordance with a fifth preferred embodiment of the present invention will be illustrated. In this embodiment, two couples of CMOS transistors 41-1, 51-1 and 41-2', 51-2' are connected in parallel to an electrode pad 36b for each pixel (as enclosed by dashed line) at their drain electrodes. These CMOS transistors are manufactured in the steps explained above in conjunction with the first embodiment except that the number of the transistors is doubled. The similar elements are given similar numerals as in the first embodiment. The electrical operation is substantially same as that of the third embodiment. Accordingly, two identical individual switching elements are prepared corresponding to one pixel so that when the operation of one of them is fault, the ability of information display can be maintained by firing the fault element by laser rays in virtue of the remaining CMOS transistors. For this reason, the conductive transparent pads are formed in order not to cover these TFTs.

The representative example of the driving method in accordance with the fifth embodiment of the present invention will be explained with reference to FIG. 16. In FIG. 16, explanation is made for the display as shown in FIG. 15 but expanded in a 4×4 matrix. Tie configuration, however, is substantially indentical except the number of pixels. FIG. 16 illustrates the control signals applied to the $V_{DD}$ lines, the $V_{SS}$ lines, the $V_{GG}$ lines and the back electrode in the same manner as the second embodiment. In this driving method, the control signals applied to the $V_{GG}$ lines are addressing signals which repeatedly scan front the first row to the forth row as shown in FIG. 16. A negative pulse is applied to the $V_{GG}$ line connected to an addressed column. The control opposite signals applied to the $V_{DD}$ and VSS lines are data signals which determine the visual pattern appearing on the display.

If a pixel oil the i-th row and the j-th column is desired to be actuated, opposed pulses are applied to the $V_{DD}$ and VSS lines of the i-th row at tile time when the j-th column is addressed by applying a negative pulse to the $V_{GG}$ line on the j-th column. In FIG. 16, the pixel on the first column and the first row is actuated in the first frame between $T_1$ and $T_2$, the second frame between $T_2$ and $T_3$ and the fifth frame between $T_5$ and $_6$. The back electrode is biassed by a negative voltage between $T_1$ and $T_6$. The $V_{DD}$, $V_{SS}$ and $V_{GG}$ signal levels and the bias voltage are for example 20V, -20V, ±10V and ±10V respectively in the case that the optical characteristic of the liquid crystal is changed by the threshold voltage of 20V. Accordingly, as understood from FIG. 12, such a high voltage as 30V is applied only to the selected pixel while the voltage level applied to the other pixel can not exceed 10V. In $T_6$ to $T_8$ in FIG. 16, the voltage levels at the $V_{GG}$ lines and the back electrode are inversed so that the sign of the applied voltage on each pixel is simply inversed. Accordingly, such a low voltage as -30V is applied only to the selected pixel while the absolute voltage level applied to the other pixel can not exceed 10V. The pixel on the first column and the first row is actuated in the sixth frame between $T_6$ and $T_7$. The inversion of the signs takes place repeatedly once per several frames to several tens of frames so that the average voltage applied to the liquid crystal approaches to zero resulting in effective prevention of deterioration of the liquid crystal. In the case that the threshold voltage of the liquid crystal is 2.5 V, the signal levels of these VDD, VSS and VGG lines are selected respectively to be 5V, -5V and ±7V.

Figure 17:
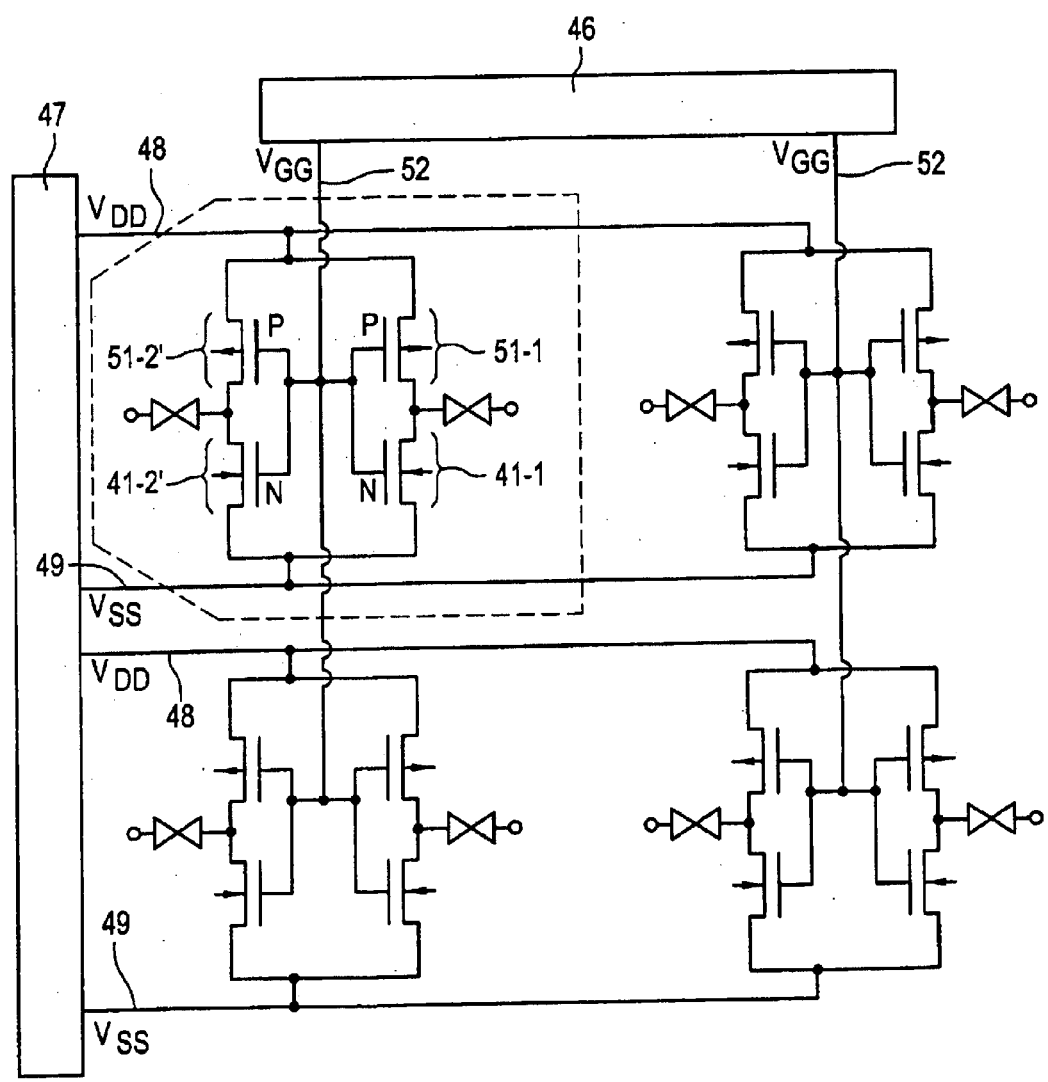
FIG. 17 is a schematic diagram showing an equivalent circuit of a liquid crystal display in accordance with a sixth embodiment of the present invention.
Figure 18:
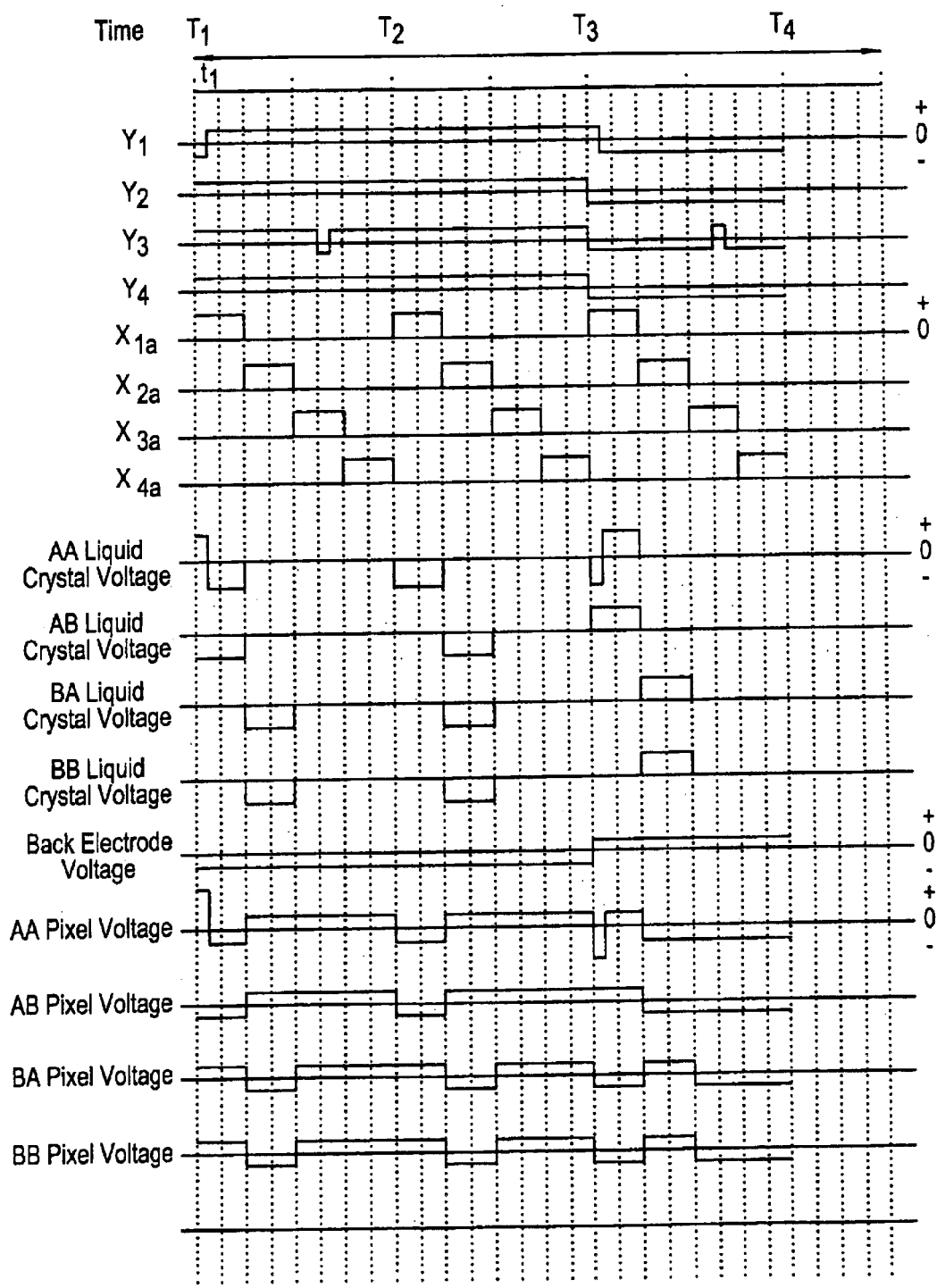
FIG. 18 is a chlonological diagram demonstrating operation of the liquid crystal display in accordance with the sixth embodiment.

Referring to FIGS. 17 and 18, a sixth preferred embodiment of the present invention will be illustrated. Also in this embodiment, two couples of CMOS transistors 41-1, 51-1 and 41-2', 51-2' are connected in parallel to an electrode pad 37b for each pixel at their drain electrodes. The electrode pad 37b, however, is separated into two portions 37b-1 and 37b-2 each independently connected to a corresponding one of the two CMOS transistors in the same manner as FIG. 10(B). These CMOS transistors are manufactured in the steps explained above in conjunction with the first embodiment except for the number of the transistors. The similar elements are given similar numerals as in the first embodiment. Then, each pixel comprises two individual sub-pixels. In accordance with this embodiment, even if the operation of one of the sub-pixels is fault, the other sub-pixel can support the operation of the pixel and therefore the possibility of deterioration in grey scale is substantially decreased. Also, even when the operational speed of one sub-pixel becomes low, the quality of the displayed image is not so deteriorated.

The representative example of the driving method in accordance with the sixth embodiment of the present invention will be explained with reference to FIG. 18. In FIG. 18, explanation is made for the display as shown in FIG. 17 but expanded in a 4×4 matrix. The configuration, however, is substantially indentical except the number of pixels. FIG. 18 illustrates the control signals applied to the $V_{DD}$ lines, the $V_{SS}$ lines, the $V_{GG}$ lines and the back electrode in the same manner as the fourth embodiment. In this driving method, the control signals applied to the $V_{DD}$ and VSS lines are addressing signals which scan from the first row to the fourth row as shown in FIG. 18. Opposed pulses are applied to the $V_{DD}$ and VSS lines connected to an addressed row. The control signals applied to the $V_{GG}$ lines are data signals which determine the visual pattern appearing on the display. In this embodiment, however, control signals applied to the $V_{GG}$ lines are negative pulses whose pulse width is only one 16th of one frame (e.g. between $T_1$ and $T_2$). The pulse width of addressing signals applied to the $V_{DD}$ and VSS lines is on the other hand one fourth of the frame in the same manner as the second embodiment.

If a pixel on the i-th row and the j-th column is desired to be actuated, a negative pulse is applied to the $V_{GG}$ line of the j-th column at the time when the i-th row is addressed by applying opposed pulses to the VDD and VSS lines on the i-th row. In FIG. 12, the pixel on the first column and the first row is actuated in the first frame between $T_1$ and $T_2$. The back electrode is biassed by a negative voltage between $T_1$ and $T_3$. The $V_{DD}$, VSS and $V_{GG}$ signal levels and the bias voltage are for example 20V, -20V, ±10V and ±10V respectively in the case that the optical characteristic of the liquid crystal is changed by the threshold voltage of 20V in the same manner. Accordingly, as understood from FIG. 18, such a high voltage as 30V is applied only to the selected pixel while the voltage level applied to the other pixel can not exceed 10V. In $T_3$ to $T_4$ in FIG. 18, the voltage levels at the $V_{GG}$ lines and the back electrode are inversed so that the sign of the applied voltage on each pixel is simply inversed. Accordingly, such a low voltage as -30V is applied only to the selected pixel while the absolute voltage level applied to the other pixel can not exceed 10V. The pixel on the first column and the first row is actuated in the third frame between $T_3$ and $T_4$. The inversion of the signs takes place repeatedly once per several frames to several tens of frames so that the average voltage applied to the liquid crystal approaches to zero resulting in effective prevention of deterioration of the liquid crystal. In the case that the threshold voltage of the liquid crystal is 2.5 V, the signal levels of these VDD, VSS and VGG lines are selected respectively to be 5V, -5V and ±7V.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Examples are as follows:

In the liquid crystal displays as illustrated above, P-type TFTs are connected to the $V_{DD}$ line while N-type TFTs are connected to the $V_{SS}$ line. However, these can be connected vice versa. Namely, N-type TFTs are connected to the $V_{DD}$ line while P-type TFTs are connected to the $V_{GG}$ line. For this purpose, the locations of the N-type TFTs and the P-type TFTs are exchanged in the above embodiments. In this case, the voltage of the liquid crystal layer (the voltage of the pad) at the respective pixel becomes the same level as the $V_{GG}$ rather than the $V_{SS}$ when the pixel is selected by the column driver 46.

Figure 1:
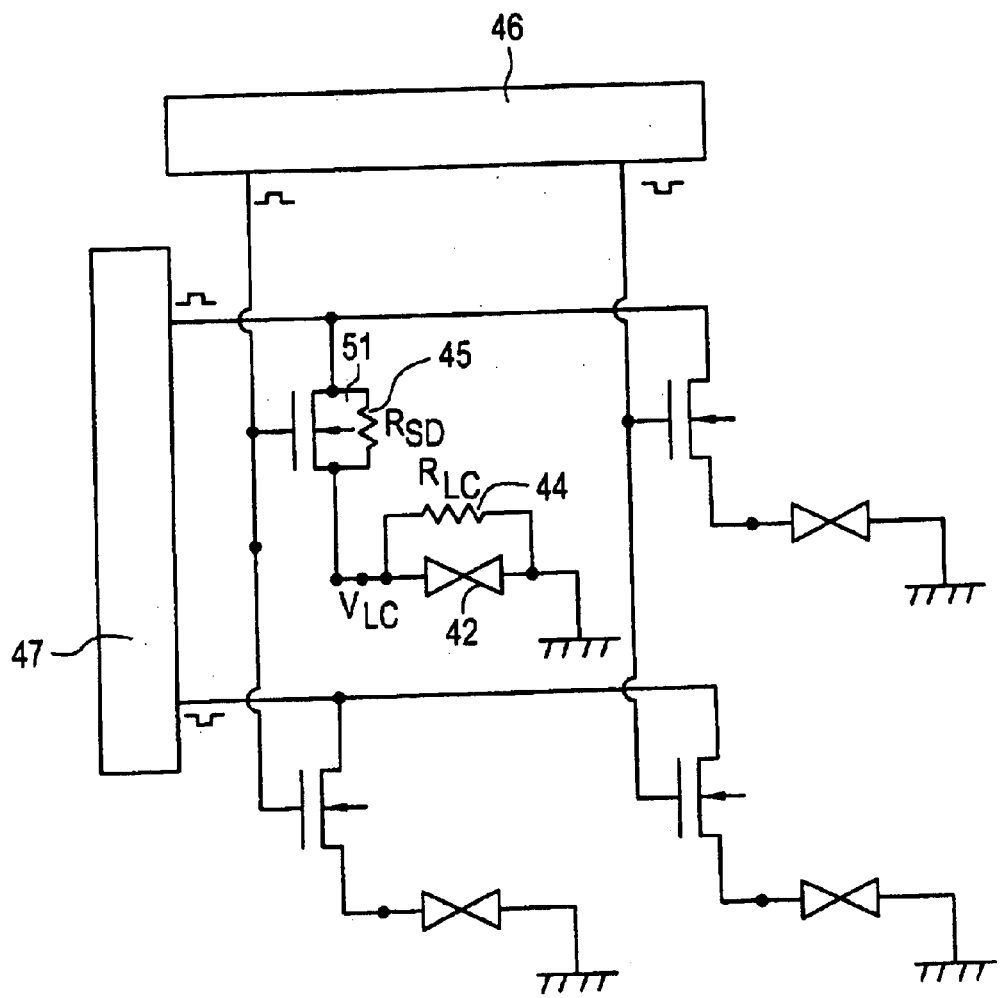
FIG. 1 is a schematic diagram showing an equivalent circuit of a liquid crystal display.

The above embodiments are applications in the form of CMOSs for switching devices in liquid crystal displays. The TFT in accordance with the present invention, however, can be utilized in the form of a switching device comprising one TFT for driving one pixel. In this case, the equivalent circuit is substantially same as that illustrated in FIG. 1 except that the resister $R_{SD}$ is not effective because. the N-type TFT is constructed with a spoiled semiconductor film which is not sensitive to incident light as explained above. The electrode pad of each pixel becomes electrically floating when not addressed in this modification so that the voltage level thereof may not be so fixed as compared with those utilizing CMOSs. The manufacturing process thereof, however, is very simple without the need of light blocking means.

The liquid crystal material used in the liquid crystal display may include other type materials. For example, a suitable phase transition liquid crystal materials can be prepared by adding an ion dopant into a nematic liquid crystal material of guest-host type or dielectric anisotropic type. The phase transition liquid crystal material changes, in accordance with application of an electric field, its optical appearance from a transparent state to a cloudy state and vice versa through phase transition between its nematic phase and its cholesteric phase. Furthermore in place of liquid crystals, suitable light influencing materials are also utilized in the same purpose such as electrophoresis dispersions which are prepared by dispersing pigment particles in an organic liquid which has been colored by a dye. If grey scale is desired, a plurality of frames are given to one image to be displayed and selected pixels are actuated only in a fewer frames than the given frames in accordance with the desired grey tone.

The present invention can be applied to displays utilizing other types of semiconductor devices such as germanium or silicon/germanium ($Si_xGe_{1-x}$) semiconductor devices, in which case the thermal treatment can be done at temperatures approx. 100° C. lower than those used for silicon semiconductors in the above embodiments. The deposition of such semiconductor can be carried out by sputtering in a high energy hydrogen plasma caused by optical energy (shorter than 1000 nm wavelength) or electron cyclotron resonance (ECR). Instead of gases including hydrogen molecules, some hydrogen compounds can be used as the atmosphere of sputtering as long as not to be impurity. For example, monosilane or disilane may be used for forming silicon semiconductor transistors. Although in the preferred embodiments, oxide and semiconductor films are deposited respectively in separate apparatuses, it is apparently also possible to deposit other types of gate insulating films or gate electrodes in a common apparatus. During deposition of oxide films, a halogen such as fluorine may be used as an atmosphere of sputtering so as to introduce halogen atoms into the oxide films in order to effectively prevent alkali metal atoms from getting into the film from the glass substrate by virtue of neutralization. The same effect can be expected by introduction of phosphorus in place of halogens.

The present invention can be applied for other types of optical devices utilizing semiconductor devices such as image sensors, load elements or three-dimensional elements of monolithic integrated semiconductor devices. In the preferred embodiments field effect transistors are formed on a glass substrate. However, other substrates can be used instead. For example, thin film field effect transistors may be form d on a silicon substrat in a liquid crystal display or an image sensor device. This silicon substrate may be an intrinsic silicon substrate, a p-type silicon substrate, an n-type silicon substrate, or a silicon substrate in which MOSFETs, bipolar transistors, or the like are provided in the form of IC. An insulating layer is provided between such a substrate and the thin film field effect transistors although such an insulating layer may be dispensed with in the case of the intrinsic silicon substrate.

A gate electrode may be either a single layer electrode or a multi-layer electrode in a gate insulated field effect transistor in accordance with the present invention. The single layer gate electrode may be a silicon electrode doped with phosphorus or an aluminum electrode. The multi-layer gate electrode may be a two-layer electrode which consists of a lower chromium layer and an upper aluminum layer formed thereon or a two-layer electrode which consists of a lower silicon layer doped with phosphorus and an upper metallic or metal silicide layer formed thereon. The aluminum single layer electrode and the upper aluminum layer can be formed by sputtering an aluminum target. The silicon single layer electrode and the lower silicon layer can be formed by low pressure CVD or by sputtering a silicon target doped with phosphorus. The lower chromium layer can be formed by sputtering a chromium target. The metallic layer may be a molybdenum layer formed by sputtering a molybdenum target, a wolfram layer formed by sputtering a wolfram target, a titanium layer formed by sputtering a titanium target, or an aluminum layer formed by sputtering an aluminum target. The metal silicide layer may be a $MoSi_2$ layer formed by sputtering a $MoSi_2$ target, a $WSi_2$ layer formed by sputtering a $WSi_2$ target, or a $TiSi_2$ layer formed by sputtering a $TiSi_2$ target. Although the production method claims as provided infra include several steps, the order of these steps can be changed in accordance with the practical cases and should not limit the scope of patent.

What is claimed is:

1. A method of manufacturing a semiconductor device comprising:

forming a thin film transistor of a type selected from the group consisting of a staggered type, a co-planer type, an inverted staggered type, and an inverted co-planer type;

forming an interlayer insulating film comprising silicon oxide over the thin film transistor;

forming an organic resin film over the interlayer insulating film;

forming a conductive layer comprising a conductive oxide by sputtering at a temperature not higher than 150° C.; and heating said conductive layer in an oxidizing atmosphere at a temperature of 200 to 400° C.

2. The method according to claim 1, wherein said semiconductor device is a display device.

3. The method according to claim 1, wherein said conductive layer comprises indium tin oxide.

4. The method according to claim 1, wherein said organic resin film comprises polyimide.

5. A method of manufacturing a semiconductor device comprising:

forming a thin film transistor of a type selected from the group consisting of a staggered type, a co-planer type, an inverted staggered type, and an inverted co-planer type wherein said thin film transistor has a channel region comprising semi-amorphous or semi-crystal silicon;

forming an interlayer insulating film comprising silicon oxide over the thin film transistor;

forming an organic resin film over the interlayer insulating film;

forming a conductive layer comprising a conductive oxide by sputtering at a temperature not higher than 150° C.; and heating said conductive layer in an oxidizing atmosphere at a temperature of 200 to 400° C.

6. The method according to claim 5, wherein said semiconductor device is a display device.

7. The method according to claim 5, wherein said conductive layer comprises indium tin oxide.

8. The method according to claim 5, wherein said organic resin film comprises polyimide.

9. A method of manufacturing a semiconductor device comprising:

forming a semiconductor film comprising amorphous silicon on an insulating surface;

heating said semiconductor film to crystallize said semiconductor film;

forming an interlayer insulating film comprising silicon oxide over the semiconductor film;

forming at least one contact hole in said interlayer insulating film to expose an impurity region of said semiconductor film;

forming an electrode on said interlayer insulating film wherein said electrode is connected to said impurity region through said contact hole;

forming an organic resin film over said electrode and said interlayer insulating film;

forming a conductive layer comprising a conductive oxide by sputtering at a temperature not higher than 150° C.; and heating said conductive layer in an oxidizing atmosphere at a temperature of 200 to 400° C. wherein said conductive layer is electrically connected to said electrode through a contact hole of said organic resin film.

10. The method according to claim 9, wherein said semiconductor device is a display device.

11. The method according to claim 9, wherein said conductive layer comprises indium tin oxide.

12. The method according to claim 9, wherein said organic resin film comprises polyimide.

13. A method of manufacturing a semiconductor device comprising:

forming a thin film transistor of a type selected from the group consisting of a staggered type, a co-planer type, an inverted staggered type, and an inverted co-planer type;

forming an interlayer insulating film comprising silicon oxide over the thin film transistor;

forming a planarizing film comprising a resin over the interlayer insulating film;

forming a conductive layer comprising a conductive oxide by sputtering at a temperature not higher than 150° C.; and heating said conductive layer in an oxidizing atmosphere at a temperature of 200 to 400° C.

14. The method according to claim 13, wherein said semiconductor device is a display device.

15. The method according to claim 13, wherein said conductive layer comprises indium tin oxide.

16. The method according to claim 13, wherein said planarizing film comprises polyimide.

17. A method of manufacturing a semiconductor device comprising:

forming a thin film transistor of a type selected from the group consisting of a staggered type, a co-planer type, an inverted staggered type, and an inverted co-planer type wherein said thin film transistor has a channel region comprising semi-amorphous or semi-crystal silicon;

forming an interlayer insulating film comprising silicon oxide over the thin film transistor;

forming a planarizing film comprising a resin over the interlayer insulating film;

forming a conductive layer comprising a conductive oxide by sputtering at a temperature not higher than 150° C.; and heating said conductive layer in an oxidizing atmosphere at a temperature of 200 to 400° C.

18. The method according to claim 17, wherein said semiconductor device is a display device.

19. The method according to claim 17, wherein said conductive layer comprises indium tin oxide.

20. The method according to claim 17, wherein said planarizing film comprises polyimide.

21. A method of manufacturing a semiconductor device comprising:

forming a semiconductor film comprising amorphous silicon on an insulating surface;

heating said semiconductor film to crystallize said semiconductor film;

forming an interlayer insulating film comprising silicon oxide over the semiconductor film;

forming at least one contact hole in said interlayer insulating film to expose an impurity region of said semiconductor film;

forming an electrode on said interlayer insulating film wherein said electrode is connected to said impurity region through said contact hole;

forming a planarizing film comprising a resin over the interlayer insulating film;

forming a conductive layer comprising a conductive oxide by sputtering at a temperature not higher than 150° C.; and heating said conductive layer in an oxidizing atmosphere at a temperature of 200 to 400° C. wherein said conductive layer is electrically connected to said electrode through a contact hole of said organic resin film.

22. The method according to claim 21, wherein said semiconductor device is a display device.

23. The method according to claim 21, wherein said conductive layer comprises indium tin oxide.

24. The method according to claim 21, wherein said planarizing film comprises polyimide.

* * * * *